(12) United States Patent
Chang

(10) Patent No.: US 11,474,428 B2
(45) Date of Patent: Oct. 18, 2022

(54) PHOTOMASK AND METHOD OF REPAIRING PHOTOMASK

(71) Applicant: TAIWAN SEMICONDUCTOR MANUFACTURING COMPANY LTD., Hsinchu (TW)

(72) Inventor: Hao-Ming Chang, Pingtung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/398,707

(22) Filed: Aug. 10, 2021

(65) Prior Publication Data

US 2021/0373435 A1 Dec. 2, 2021

Related U.S. Application Data

(63) Continuation of application No. 16/586,393, filed on Sep. 27, 2019, now Pat. No. 11,099,477.

(51) Int. Cl.
*G03F 1/72* (2012.01)
*G03F 1/24* (2012.01)
*G03F 1/38* (2012.01)

(52) U.S. Cl.
CPC .................. *G03F 1/72* (2013.01); *G03F 1/24* (2013.01); *G03F 1/38* (2013.01)

(58) Field of Classification Search
CPC .................. G03F 1/24; G03F 1/38; G03F 1/72
USPC .............................................. 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

*Primary Examiner* — Christopher G Young
(74) *Attorney, Agent, or Firm* — WPAT, P.C., Intellectual Property Attorneys; Anthony King

(57) ABSTRACT

The present disclosure provides a photomask and a method for repairing a photomask. The photomask includes a substrate, a reflective multi-layer stack over the substrate, a capping layer over the reflective multi-layer stack, an absorber layer over the capping layer, a first patch layer in direct contact with the absorber layer, and a second patch layer over a surface of the first patch layer.

20 Claims, 49 Drawing Sheets

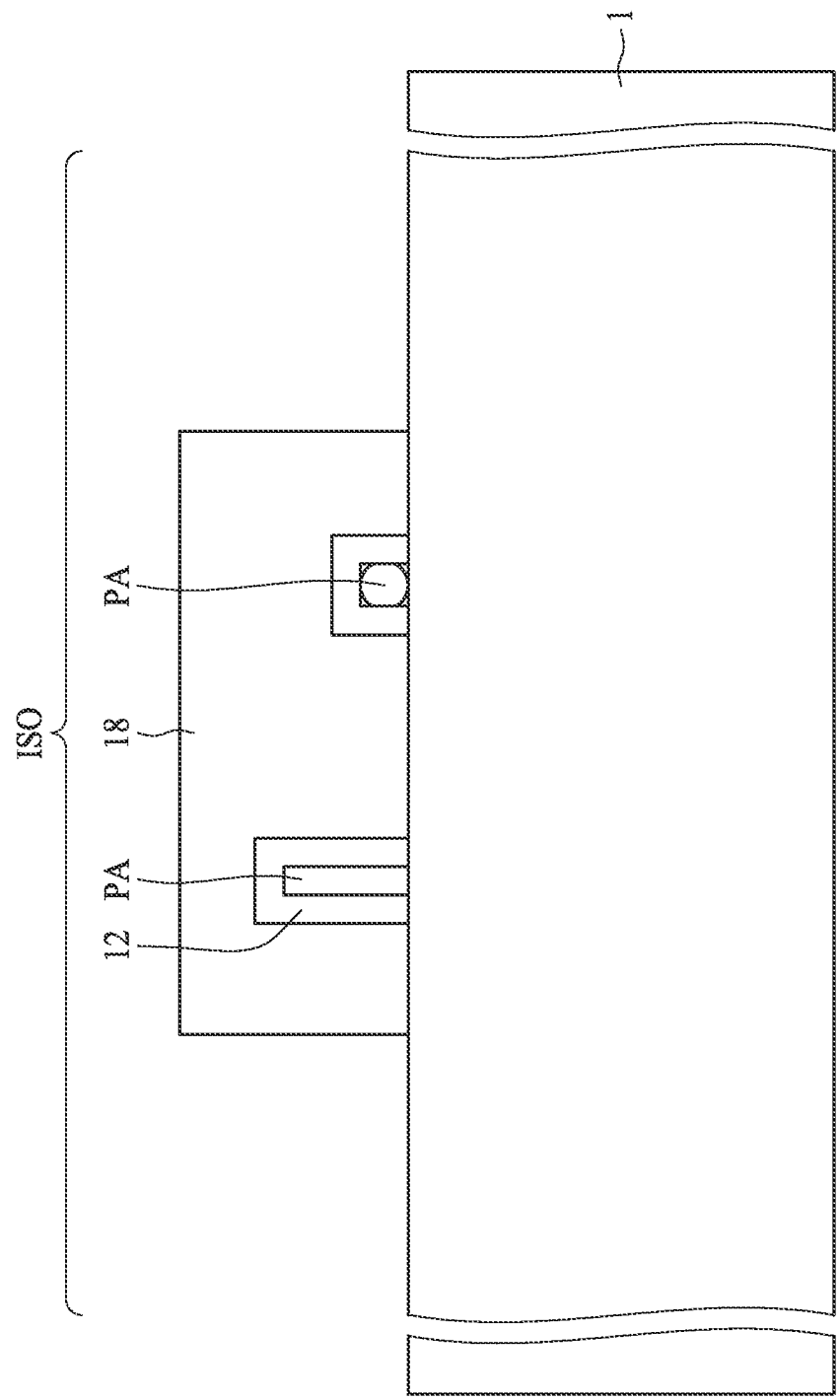

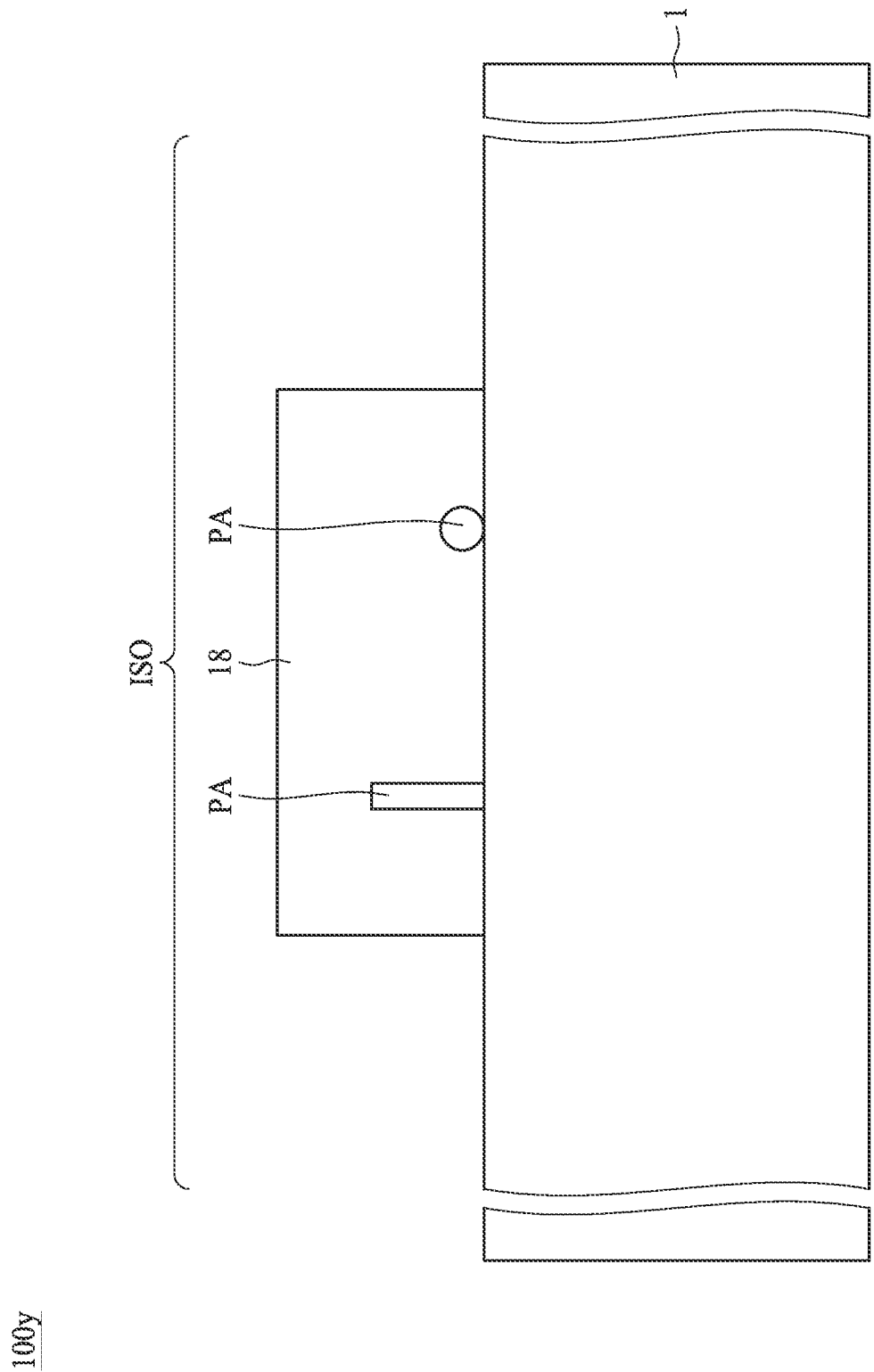

PHOTOMASK AND METHOD OF REPAIRING PHOTOMASK

CROSS REFERENCE TO RELATED APPLICATIONS

This application is a continuation of U.S. patent application Ser. No. 16/586,393, filed Sep. 27, 2019, and claims the benefit thereof under 35 U.S.C. 120.

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

As semiconductor industry continues to evolve, advanced photolithography techniques have been widely used in integrated circuit fabrication operation. Photolithography operations may include techniques pertinent to coating a photoresist layer on a wafer and exposing the wafer to an exposing source.

Masks can be used in semiconductor fabrication operations to transfer a predetermined pattern onto a substrate. For example, after forming a photoresist layer over a substrate, the photoresist layer can be exposed to an actinic radiation through a mask. For another example, after forming a photoresist layer over a substrate, the photoresist layer can be exposed to an actinic radiation reflected by a mask. Thereby, a photoresist pattern can be formed by subsequent development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a schematic drawing illustrating an enlarged cross sectional view of an isolation region of a photomask, according to some embodiments of the present disclosure.

FIG. 4C is a schematic drawing illustrating an enlarged cross sectional view of an isolation region of a photomask, according to some embodiments of the present disclosure.

FIG. 7A' to FIG. 7B' are cross sectional views of a photomask during intermediate repairing operations, according to some embodiments of present disclosure.

FIG. 9A' is a cross sectional view of a photomask during intermediate repairing operations, according to some embodiments of present disclosure.

DETAILED DESCRIPTION

Figure 1A:
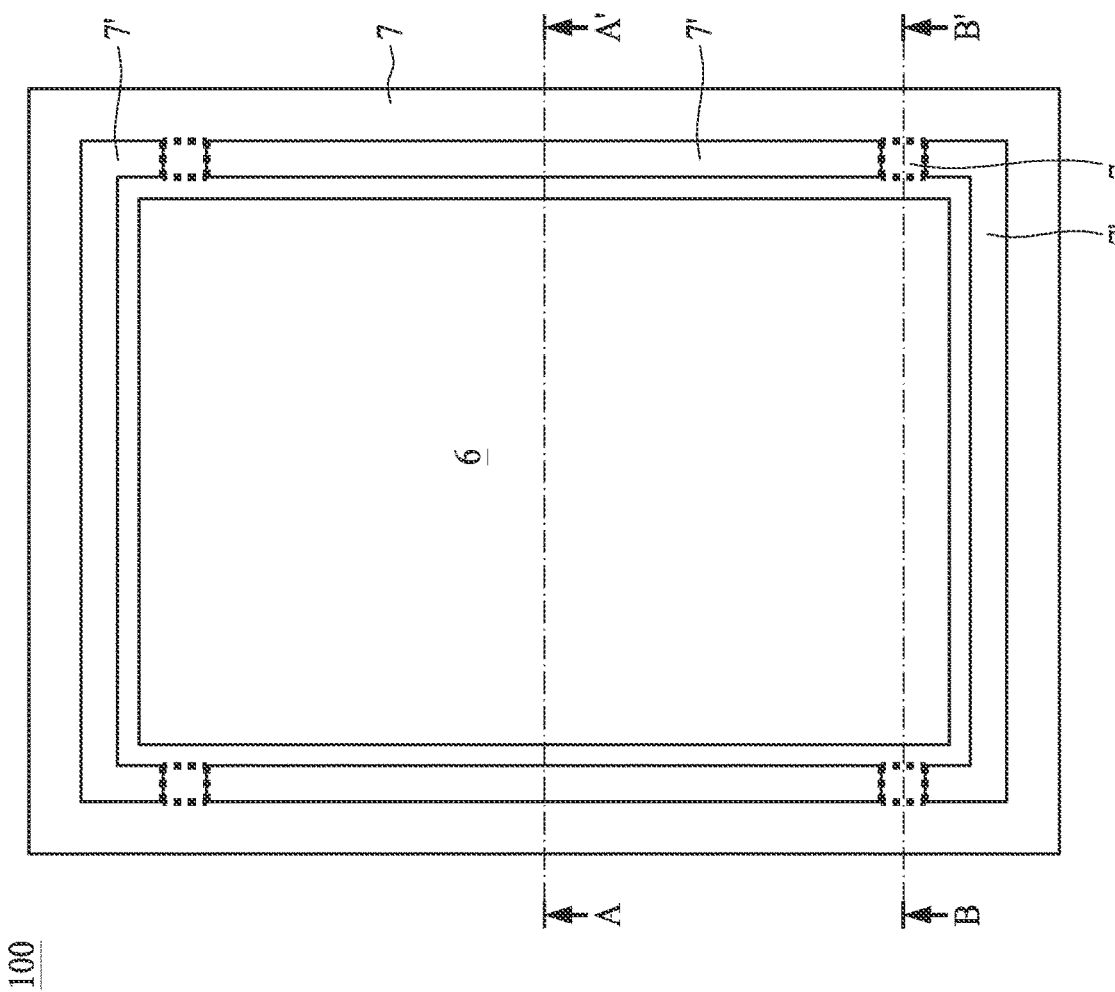
FIG. 1A is a schematic drawing illustrating a top view of a photomask, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

During the fabrication or using of photomask, defects may be introduced on a surface of the photomask. For one example, particles may fall on the photomask. For another example, when fabricating an extreme ultraviolet (EUV) mask, carbon contamination may occur due to permeation of oxygen and/or hydrogen during fabrication. The aforesaid defects may cause degradation of photolithography performance.

In order to remove such defects and/or particles and extend the lifetime of photomask, cleaning operation may be performed on the photomask. In order to effectively remove particles, the cleaning operation may include applying reactive wet chemicals (which may include basic formulation, acidic formulation, and/or hydrogen dioxide) and/or performing photoresist strip. It is observed that the photomask may suffer from defect such as (but not limited to) an absence of a desired photomask feature, a damaged or absent scattering bar, an absence of material from a larger pattern feature, or any undesirable material loss of the photomask, the photomask may be subjected to be repaired to compensate such defects. Specifically, such defects can be observed after fabrication or using of the photomask. However, the repaired part of the repaired photomask may again suffer from material loss (or peeling) after cycle(s) of cleaning operations, thence the shape of the mask pattern as a whole after cleaning may deviate from the predetermined design layout, and the pattern form on an underlying photoresist layer may deviate from the predetermined pattern. It may also be observed that a critical dimension of a feature may be undesirably changed after cleaning.

In order to alleviate material loss under cleaning operation, and to reduce the impact of contaminants/particles on the photomask, the present disclosure provides a photomask and a method for repairing the photomask. Specifically, the present disclosure provides a method of repairing a photomask suffered from various defects, and alleviating the material loss of the repaired patch during cleaning operation. The repairing operation in the present disclosure can be performed after manufacturing a photomask and before performing a lithography operation using the photomask, or, after performing cycle(s) of lithography operation(s) using the photomask.

Figure 1B:
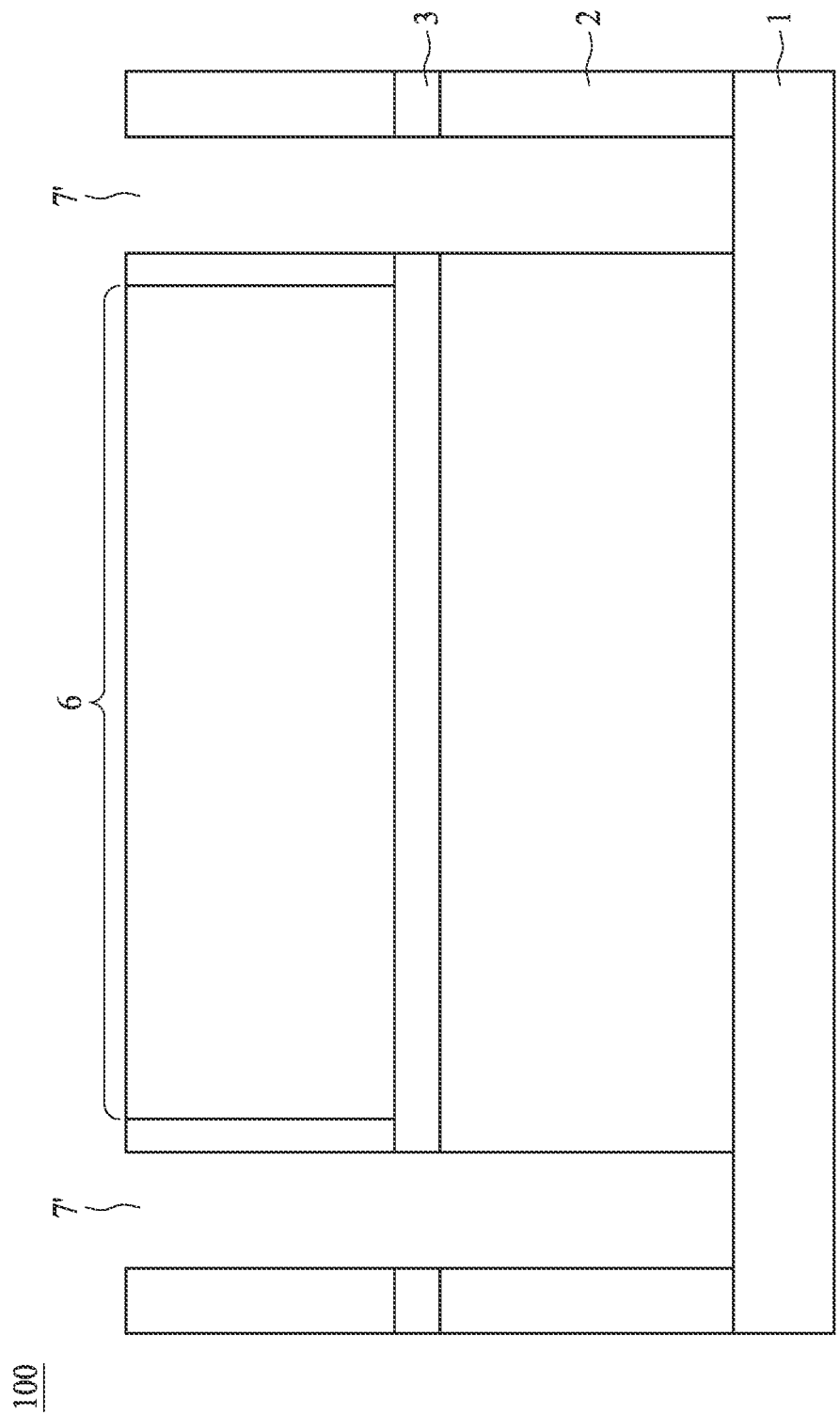
FIG. 1B is a schematic drawing illustrating a cross sectional view taken along line A-A' of FIG. 1A, showing a cross-sectional view of a photomask, according to some embodiments of the present disclosure.
Figure 1C:
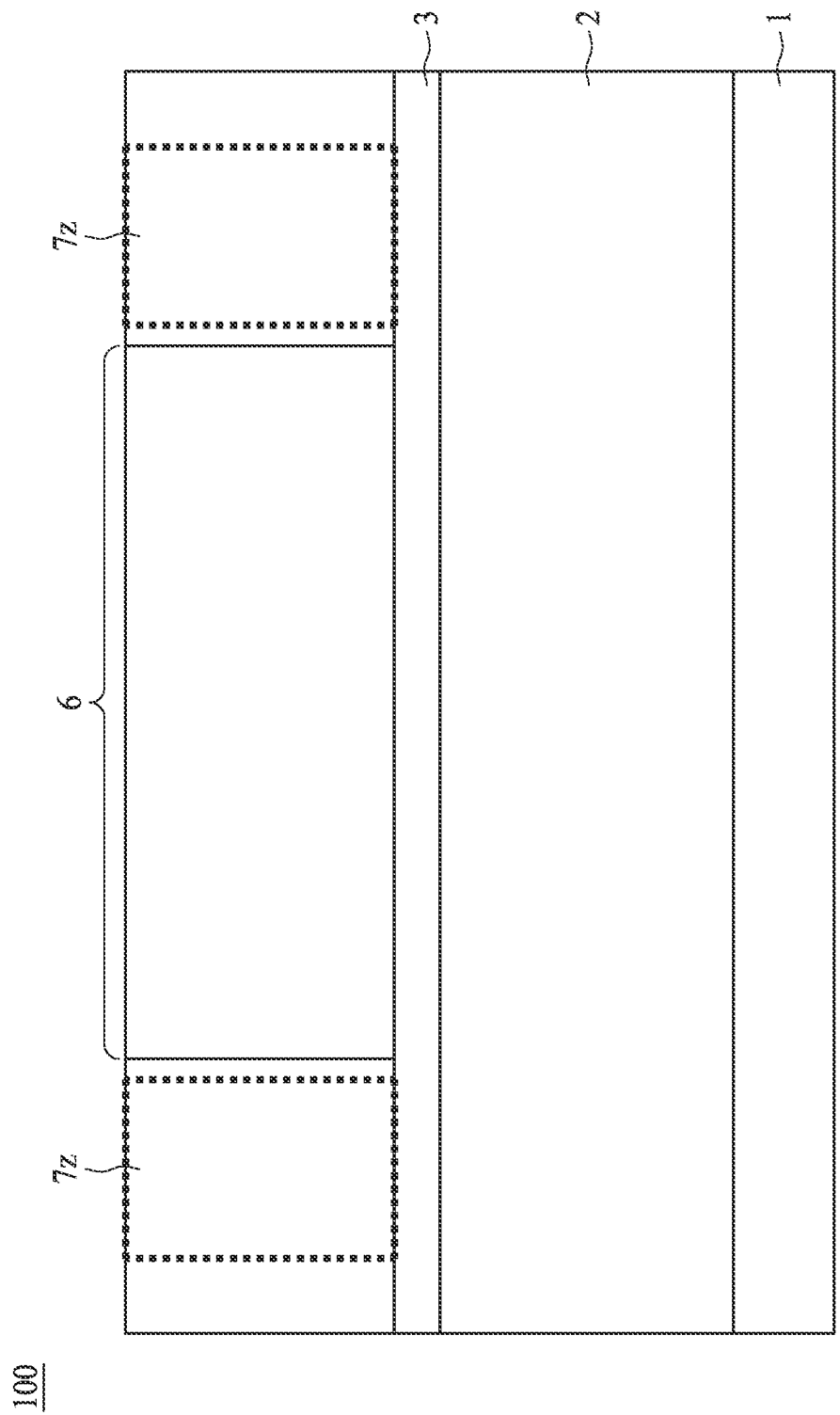
FIG. 1C is a schematic drawing illustrating a cross sectional view taken along line B-B' of FIG. 1A, showing a cross-sectional view of a photomask, according to some embodiments of the present disclosure.

Referring to FIG. 1A, FIG. 1B and FIG. 1C, FIG. 1A is a schematic drawing illustrating a top view of a photomask, FIG. 1B is a schematic drawing illustrating a cross sectional view taken along line A-A' of FIG. 1A, showing a cross-sectional view of a photomask, FIG. 1C is a schematic drawing illustrating a cross sectional view taken along line B-B' of FIG. 1A, showing a cross-sectional view of a photomask, according to some embodiments of the present disclosure. A photomask 100 is a patterned reflective mask, such as an EUV mask. The photomask 100 includes a substrate 1, which may be a low thermal expansion material substrate. The photomask 100 may further include a reflective multilayer stack 2 above the substrate 1, and a capping layer 3 above the reflective multilayer stack 2. The reflective multilayer stack 2 may include a plurality of alternative material layers (e.g. Molybdenum-Silicon (Mo—Si) stacks). In some embodiments, the capping layer 3 may include ruthenium oxide ($RuO_2$), ruthenium compound, or other suitable materials. A buffer layer (not shown in FIG. 1A to FIG. 1C) can optionally be disposed above the capping layer 3.

Furthermore, the photomask 100 includes a pattern region 6 above the capping layer 3 and a border region 7 at a peripheral area of the pattern region 6, wherein an absorber layer 4 (shown in FIG. 2A) is disposed in the pattern region 6. In some embodiments, the pattern of the absorber layer 4 in the pattern region 6 may include materials such as tantalum boron oxide-based materials (such as tantalum borate, TaBO), tantalum boron nitride (TaBN), or other suitable materials for absorbing EUV radiation. Alternatively, the absorber layer 4 can also be made of silicon derivatives, such is silicon oxide ($SiO_2$) or silicon carbide (SiC). In some embodiments, some resolution enhancement features, such as scattering bars, can be disposed in the pattern region 6. In some embodiments, a black border region 7' (which may be a trench for exposing a top surface of the substrate 1 in some embodiments) may at least partially surround the pattern region 6 and spacing between the border region 7 and the pattern region 6. A discharge bridge region 7z may be disposed to be across the black border region 7' and provide an interconnect structure between the border region 7 and the pattern region 6.

Figure 2A:
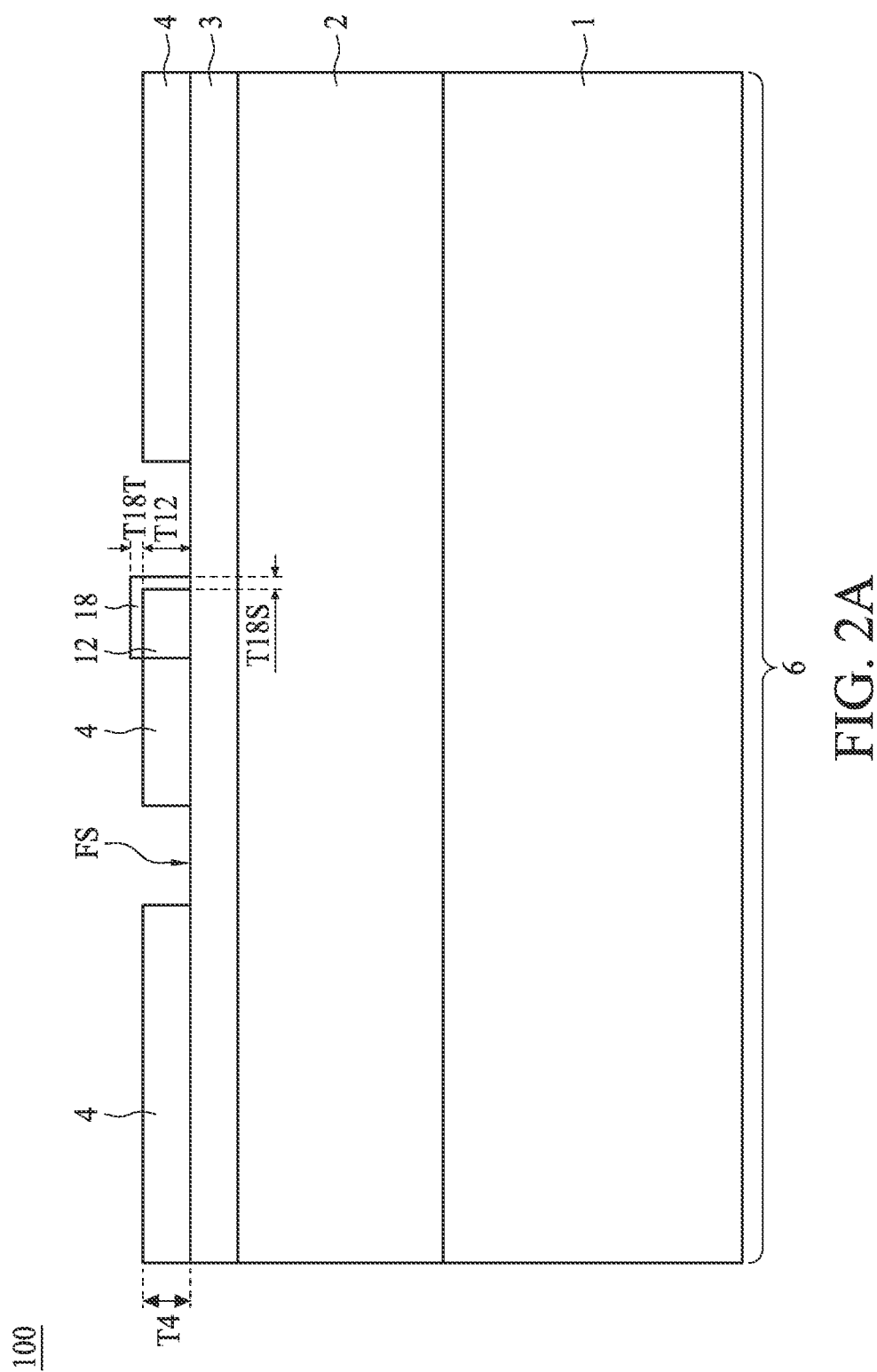
FIG. 2A is a schematic drawing illustrating an enlarged cross sectional view of a pattern region of a photomask, according to some embodiments of the present disclosure.
Figure 2B:
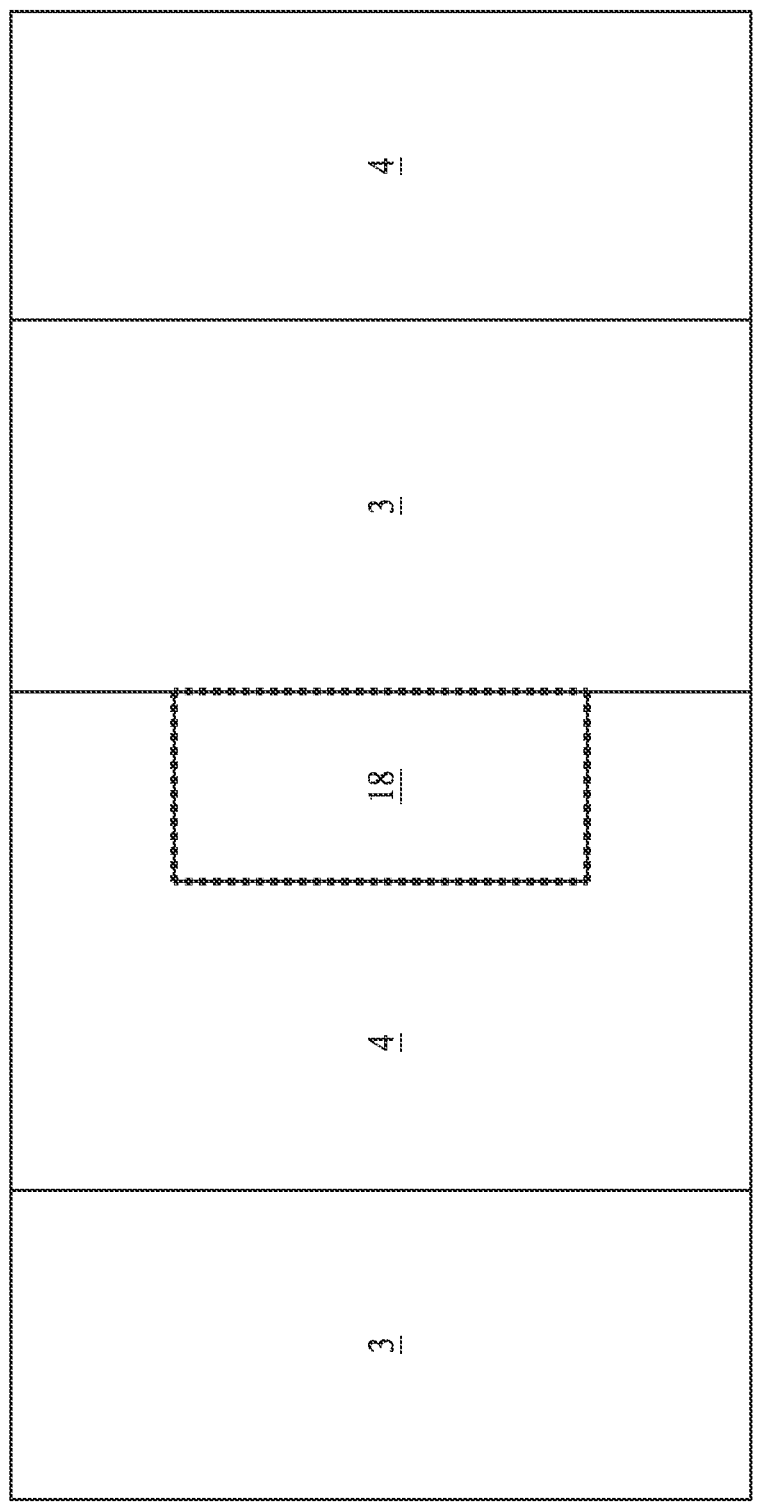
FIG. 2B is a schematic drawing illustrating a top view of a pattern region of a photomask, according to some embodiments of the present disclosure.

Referring to FIG. 2A and FIG. 2B, FIG. 2A is a schematic drawing illustrating an enlarged cross sectional view of a pattern region of a photomask, FIG. 2B is a schematic drawing illustrating a top view of a pattern region of a photomask, according to some embodiments of the present disclosure. An absorber layer 4 is disposed above the capping layer 3 (which is the front side FS of the photomask 100) and in the pattern region 6 of the photomask 100. The pattern of the absorber layer 4 can be transferred to a photoresist layer by a reflective photolithography operation. In some embodiments, a first patch layer 12 is disposed over the front side FS of the photomask 100. A bottom surface of the first patch layer 12 may be coplanar with a bottom surface of the absorber layer 4. In some embodiments, the first patch layer 12 is adjacent to a sidewall of the absorber layer 4. The first patch layer 12 may be in direct contact with the sidewall of the absorber layer 4 and the front side FS of the photomask 100. The first patch layer 12 be composed of a material that has a relatively higher absorb rate of EUV, such as chromium-containing material. A second patch layer 18 can further be formed above the first patch layer 12. The first patch layer 12 may be entirely covered by the second patch layer 18. The second patch layer 18 may further cover a sidewall of the first patch layer 12. In some embodiments, the second patch layer 18 covers the entire surface of the first patch layer 12 exposed from the absorber layer 4. Optionally, a bottom surface of the second patch layer 18 may be in contact with the front side FS of the photomask 100. A material of the first patch layer 12 is different from a material of the second patch layer 18. The material of the second patch layer 18 may have a lower etch rate than the material of the first patch layer 12 under at least one of the following types of chemicals or treatment: acidic formulation, basic formulation, hydrogen dioxide ($H_2O_2$), Sulfuric acid ($H_2SO_4$), Ammonium hydroxide ($NH_4OH$), combination of deionized water and ozone ($O_3$), application of deionized water and irradiation of light (such as ultraviolet (UV)), combination of $H_2O$ and hydrogen dioxide, SC1 solution (solution including $NH_4OH$, $H_2O_2$, $H_2O$), SPM solution (solution including $H_2SO_4$, $H_2O_2$, $H_2O$), reactive chemical, or any other chemical suitable for cleaning a photomask. In some embodiments, a material of the second patch layer 18 may be a silicon derivative material, for example, silicon oxide ($SiO_2$), silicon carbide (SiC), or the like.

Furthermore, a thickness T12 of the first patch layer 12 is comparable to a thickness T4 of the absorber layer 4. For example, a thickness T12 of the first patch layer 12 may be in a range from about 60 nm to about 90 nm when a thickness T4 is around 70 nm, but the present disclosure is not limited thereto. For another example, a thickness T12 is in a range from about 90% of thickness T4 to about 110% of thickness T4, but the present disclosure is not limited thereto. A thickness T18T of the second patch layer 18 above the first patch layer 2 is thicker than a thickness T18S of the second patch layer 18 adjacent to a sidewall of the first patch layer 12. In some embodiments, the thickness T18T is in a range from about 1 nm to about 10 nm, and the thickness T18S is in a range from about 0.5 nm to about 10 nm. If thickness T18T is thinner than 1 nm or the thickness T18S is thinner than 0.5 nm, the second patch layer 18 may not effectively protect the first patch layer 2 from being removed under the aforesaid cleaning chemical or cleaning treatment for cleaning operation. If thickness T18T is thicker than 10 nm or the thickness T18S is thicker than 10 nm, shadowing effect may be induced in exposure operation.

Figure 2D:
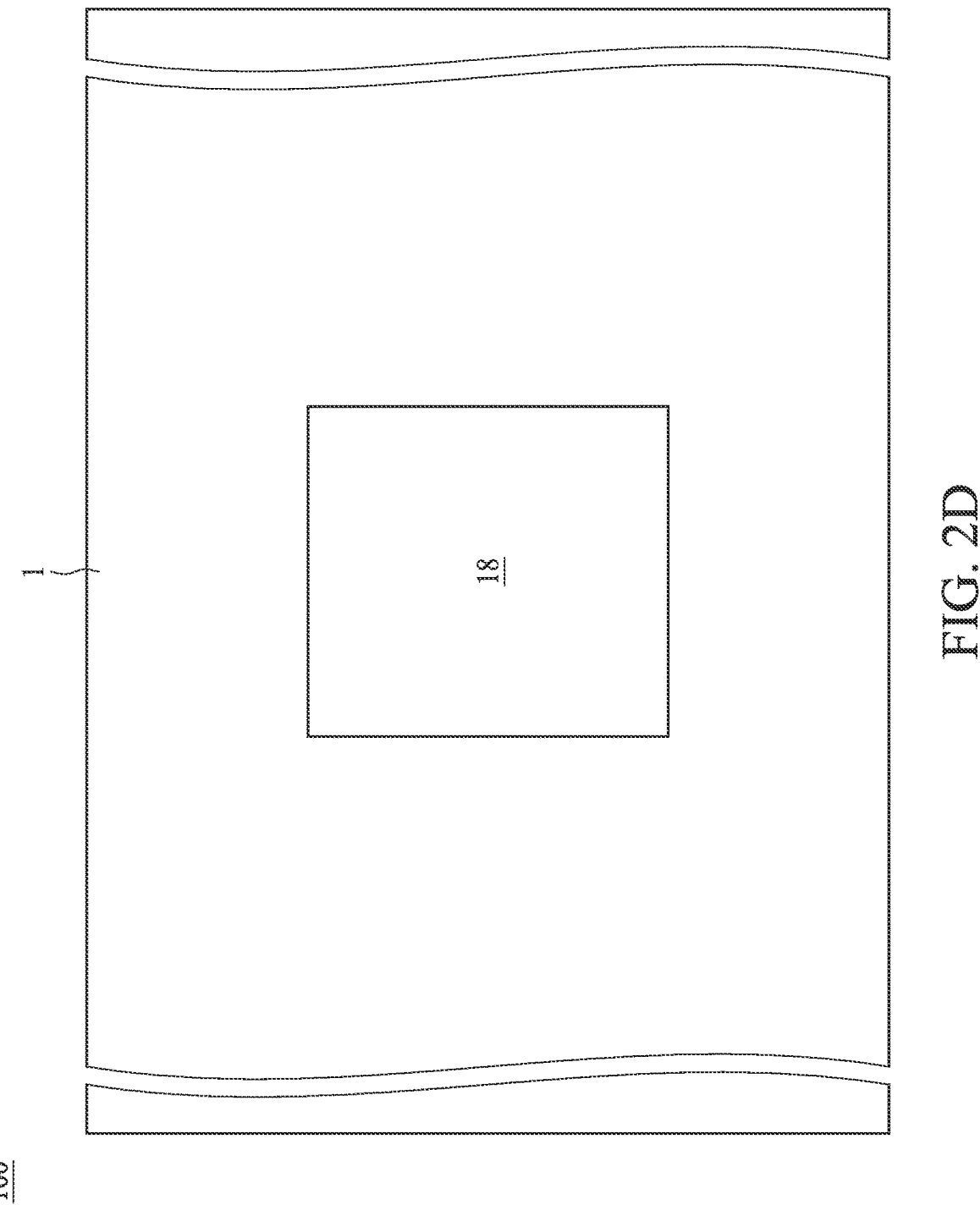
FIG. 2D is a schematic drawing illustrating a top view of an isolation region of a photomask, according to some embodiments of the present disclosure.

Referring to FIG. 2C and FIG. 2D, FIG. 2C is a schematic drawing illustrating an enlarged cross sectional view of an isolation region of a photomask, FIG. 2D is a schematic drawing illustrating a top view of an isolation region of a photomask, according to some embodiments of the present disclosure. Particles PA may fall on to an isolation region ISO of the photomask 100, and an incident radiation (such as EUV) may be reflected by the particles PA, thereby inducing undesirable defects on a photoresist layer when transferring the mask pattern in lithography operation. In some embodiments, the isolation region ISO may be in the black border region 7' as illustrated in FIG. 1A to FIG. 1C. In order to alleviate reflection of EUV in the isolation region ISO (in some cases, in the black border region 7') during exposure operation, a first patch layer 12 can be disposed above the particles PA in the isolation region ISO, and a second patch layer 18 can be disposed above the first patch layer 18. An area of the second patch layer 18 is greater than an area of the first patch layer 12 from a top perspective view, as shown in FIG. 2C. In some of the embodiments, an area of the second patch layer 18 is less than an area of the isolation region ISO from a top perspective view, thereby a portion of the substrate 1 is exposed from the second patch layer 18 in the isolation region ISO. In some embodiments, if the particles PA locate at several separated locations, a plurality of separated first patch layer 12 and the second patch layer 18 can be formed at separated locations accordingly.

The material of the first patch layer 12 and the material of the second patch layer 18, as discussed in FIG. 2A to FIG. 2B, may be able to effectively absorb a substantial portion of incident radiation irradiated thereon. Alternatively stated, in the case of the photomask is an EUV mask, at least one of the first patch layer 12 and the material of the second patch layer 18 can be selected from materials capable of absorbing EUV (e.g., λ=13.5 nm). For example, a material of the first patch layer 12 can be chromium-containing material, and the second patch layer 18 can be a silicon derivative material, such as silicon oxides or silicon carbides.

Figure 3A:
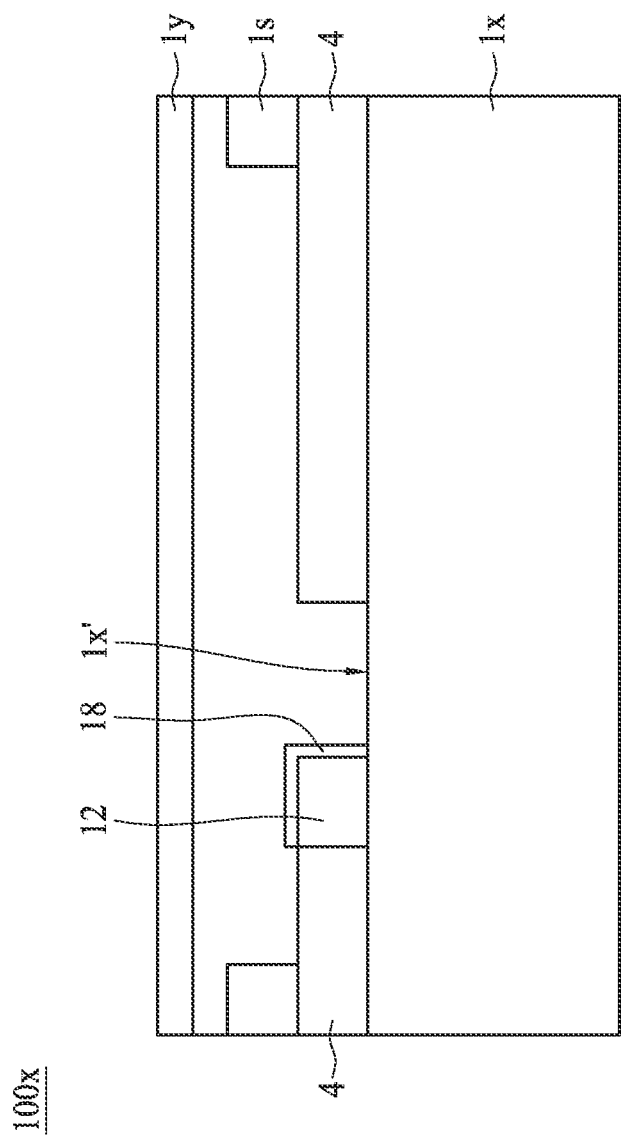
FIG. 3A is a schematic drawing illustrating a cross sectional view of a photomask, according to some embodiments of the present disclosure.
Figure 3B:
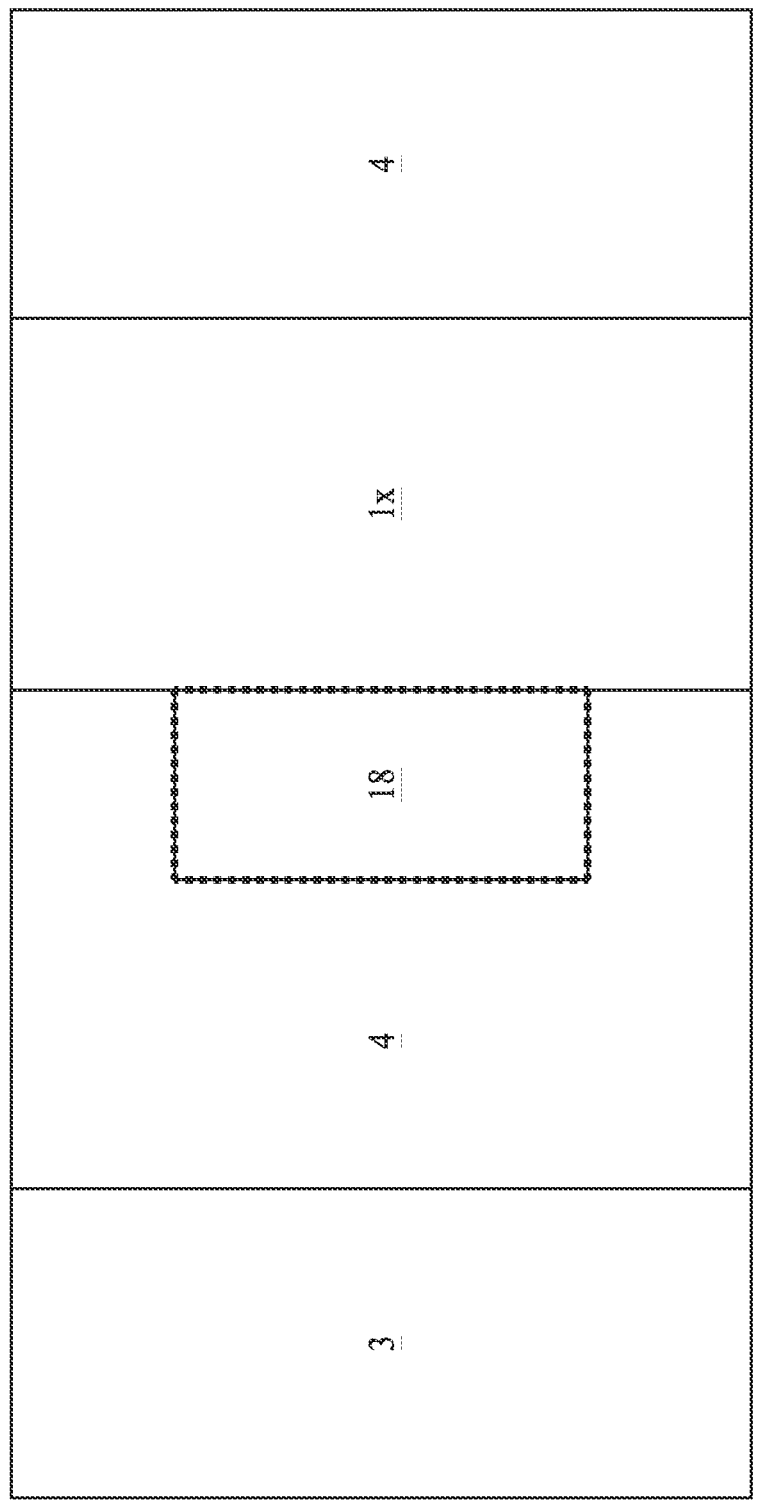
FIG. 3B is a schematic drawing illustrating a top view of a photomask, according to some embodiments of the present disclosure.

Referring to FIG. 3A and FIG. 3B, FIG. 3A is a schematic drawing illustrating a cross sectional view of a photomask, FIG. 3B is a schematic drawing illustrating a top view of a photomask (without showing the pellicle layer), according to some embodiments of the present disclosure. A photomask 100x at least include a substrate 1x, an absorber layer 4, and a pellicle layer 1y. The photomask 100x is an optical mask that allows light (such as 193 nm illumination) to pass through the substrate 1x and the pellicle layer 1y, wherein a portion of light is absorbed by the absorber layer 4. Optionally, a shielding layer 1s is further disposed on the absorber layer 4 and under the pellicle layer 1y.

Similar to the discussion in FIG. 2A to FIG. 2B, the first patch layer 12 is disposed over the first side 1x' of the substrate 1x. A bottom surface of the first patch layer 12 may be coplanar with a bottom surface of the absorber layer 4. In some embodiments, the first patch layer 12 is adjacent to a sidewall of the absorber layer 4. The first patch layer 12 may be in direct contact with the sidewall of the absorber layer 4 and the first side 1x' of the substrate 1x. A second patch layer 18 can further be formed above the first patch layer 12. The first patch layer 12 may be entirely covered by the second patch layer 18. The second patch layer 18 may further cover a sidewall of the first patch layer 12. In some embodiments, the second patch layer 18 covers the entire surface of the first patch layer 12 exposed from the absorber layer 4. Optionally, a bottom surface of the second patch layer 18 may be in contact with the first side 1x' of the photomask 100. The first patch layer 12 contains a material that is capable of absorbing optical light (e.g. 193 nm wavelength light), such as chromium-containing material. A material of the first patch layer 12 is different from a material of the second patch layer 18. The material of the second patch layer 18 may have a lower etch rate than the material of the first patch layer 12 under at least one of the following types of chemicals or treatment: acidic formulation, basic formulation, hydrogen dioxide ($H_2O_2$), Sulfuric acid ($H_2SO_4$), Ammonium hydroxide ($NH_4OH$), combination of deionized water and ozone ($O_3$), application of deionized water and irradiation of light (such as ultraviolet (UV)), combination of $H_2O$ and hydrogen dioxide, SC1 solution (solution including $NH_4OH$, $H_2O_2$, $H_2O$), SPM solution (solution including $H_2SO_4$, $H_2O_2$, $H_2O$), reactive chemical, or any other chemical suitable for cleaning a photomask. In some embodiments, a material of the second patch layer 18 may be a silicon derivative material, for example, silicon oxide ($SiO_2$), silicon carbide (SiC), or the like. The criticality of thickness of the first patch layer 12 and the second patch layer 18 may be similar to the counterpart in FIG. 2A to FIG. 2B.

Figure 4A:
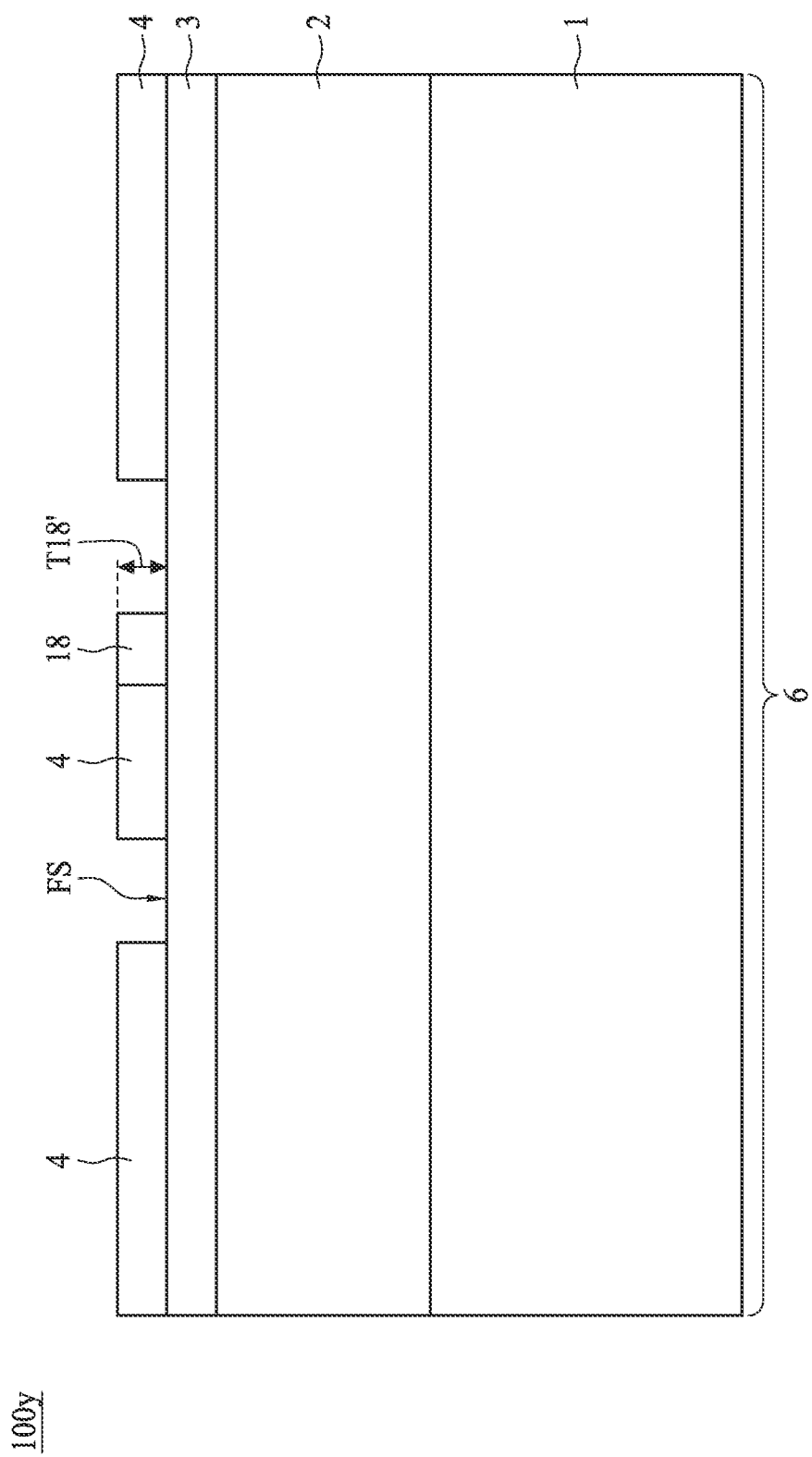
FIG. 4A is a schematic drawing illustrating an enlarged cross sectional view of a pattern region of a photomask, according to some embodiments of the present disclosure.
Figure 4B:
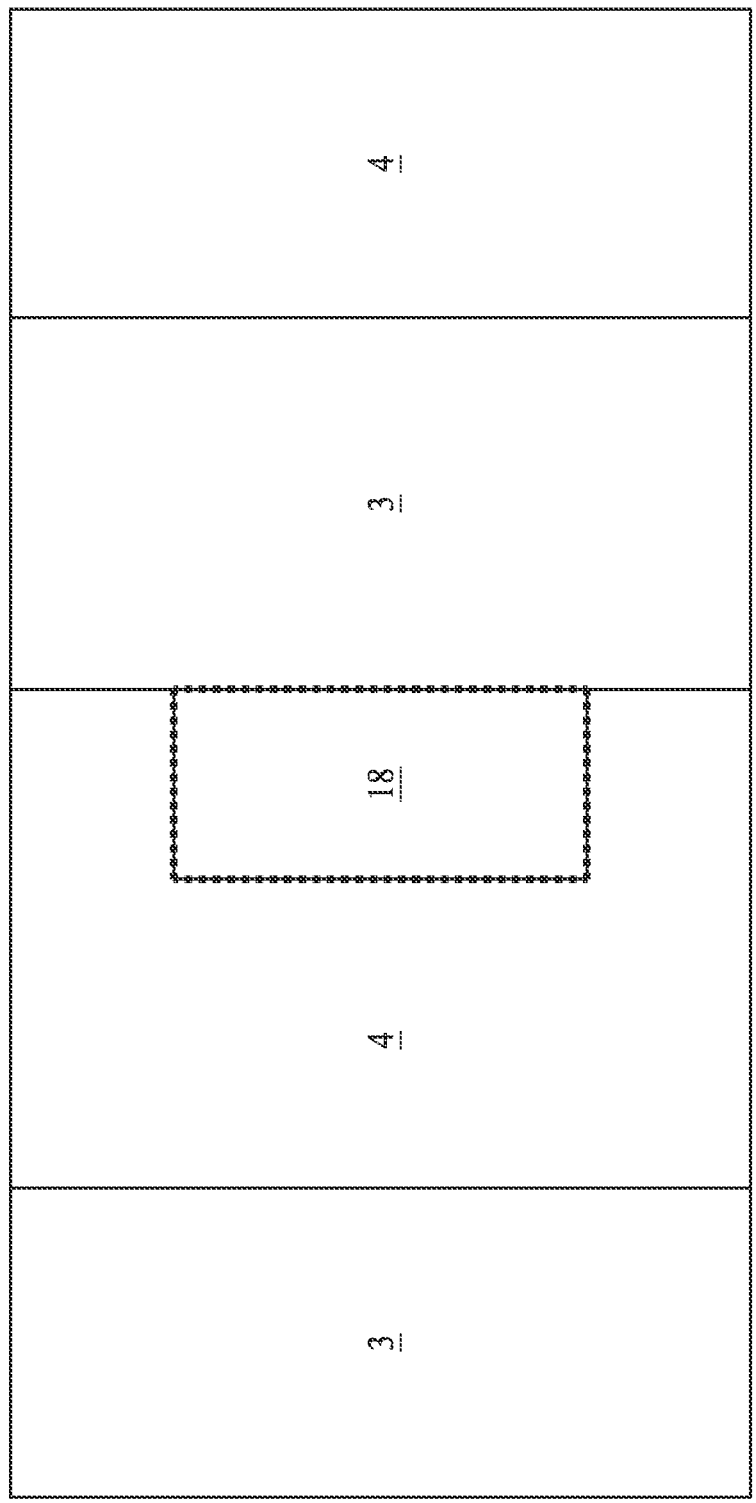
FIG. 4B is a schematic drawing illustrating a top view of a pattern region of a photomask, according to some embodiments of the present disclosure.

Referring to FIG. 4A and FIG. 4B, FIG. 4A is a schematic drawing illustrating a cross sectional view of a pattern region of a photomask, FIG. 4B is a schematic drawing illustrating a top view of a pattern region of a photomask, according to some embodiments of the present disclosure. A photomask 100y is similar to the photomask 100 as discussed in FIG. 1A to FIG. 2D, which at least includes a substrate 1 (which may be a low thermal expansion material substrate), a reflective multilayer stack 2 above the substrate 1, a capping layer 3 above the reflective multilayer stack 2, and an absorber layer 4 above the capping layer 3. Except herein the second patch layer 18 is disposed over the front side FS of the photomask 100y, and the second patch layer 18 is adjacent to a sidewall of the absorber layer 4. The material of the second patch layer 18 may have a high absorb rate of EUV radiation, such as a silicon derivative material, for example, silicon oxide ($SiO_2$), silicon carbide (SiC), or the like. In some embodiments, a bottom surface of the second patch layer 18 may be coplanar with a bottom surface of the absorber layer 4. In some embodiments, a top surface of the second patch layer 18 may be exposed from the absorber layer 4. The second patch layer 18 may be in direct contact with the sidewall of the absorber layer 4 and/or the front side FS of the photomask 100y. Furthermore, a thickness T18' of the second patch layer 18 is comparable to a thickness T4 of the absorber layer 4. For example, a thickness T18' of the first patch layer 12 may be in a range from about 60 nm to about 90 nm when the thickness T4 is about 70 nm, but the present disclosure is not limited thereto. For another example, a thickness T18' is in a range from about 90% of thickness T4 to about 110% of thickness T4, but the present disclosure is not limited thereto. It should be noted that in the case of a material of the second patch layer 18 is capable of absorbing light having other wavelength, such as 193 nm light, the aforesaid structure in FIG. 4A to FIG. 4B can also be applied to the photomask 100x as discussed in FIG. 3A.

Figure 4D:
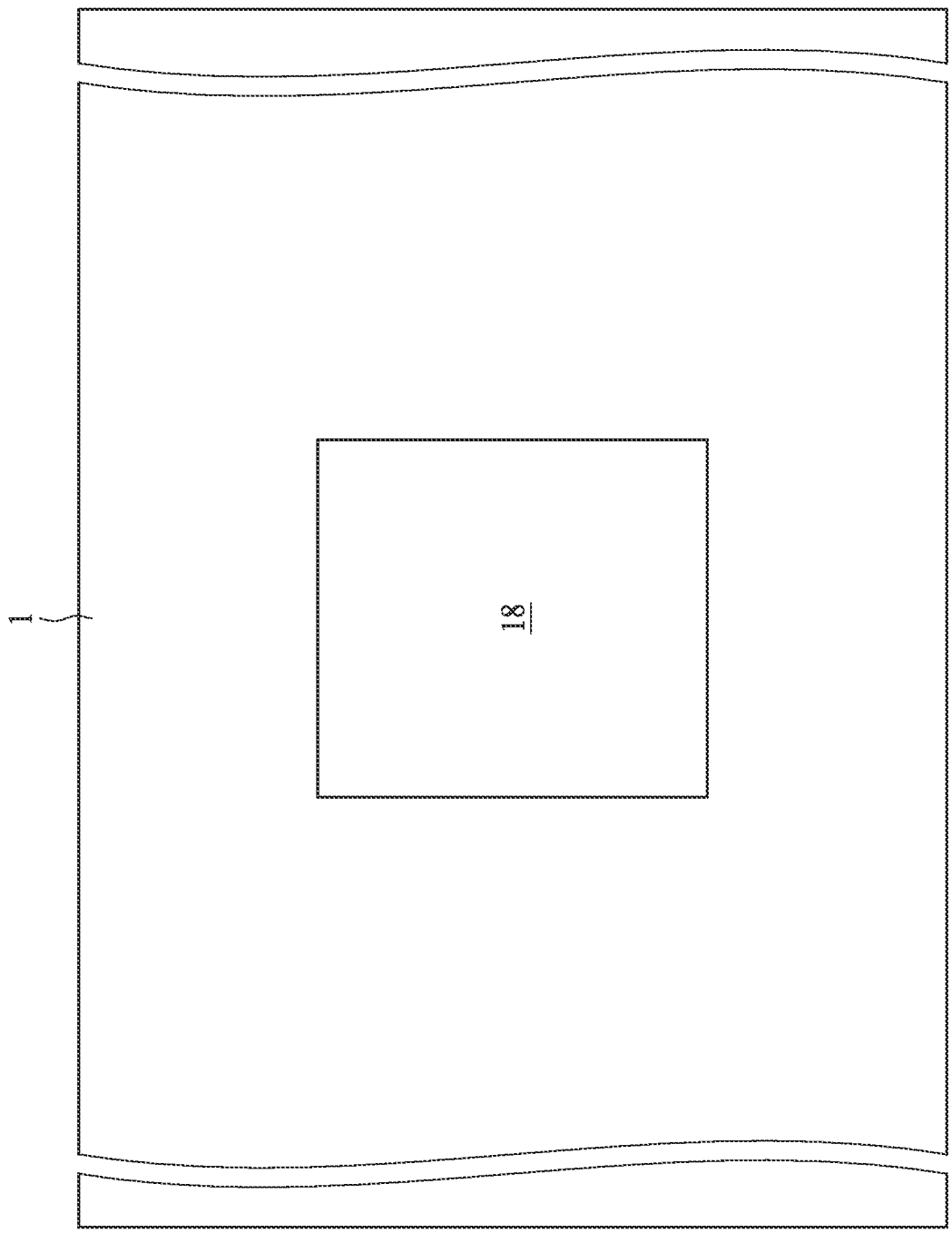
FIG. 4D is a schematic drawing illustrating a top view of an isolation region of a photomask, according to some embodiments of the present disclosure.

Referring to FIG. 4C and FIG. 4D, FIG. 4C is a schematic drawing illustrating a cross sectional view of an isolation region of a photomask, FIG. 4D is a schematic drawing illustrating a top view of an isolation region of a photomask, according to some embodiments of the present disclosure. Particles PA may fall on to an isolation region ISO of the photomask 100y, and an incident radiation (such as EUV) may be reflected or deflected by the particles PA, and induce defects om a photoresist layer in lithography operation. Similar to the discussion in FIG. 2C to FIG. 2D, the isolation region ISO may be in the black border region 7' as illustrated in FIG. 1A to FIG. 1C. In order to alleviate reflection of EUV in the isolation region ISO (in some cases, in the black border region 7') during exposure operation, a second patch layer 18 can be disposed above the particles PA fell on the isolation region ISO. In some of the embodiments, an area of the second patch layer 18 is less than an area of the isolation region ISO from a top perspective view, thereby a portion of the substrate 1 is exposed from the second patch layer 18 in the isolation region ISO. In some embodiments, if the particles PA locate at several separated locations, a plurality of separated second patch layer 18 can be formed at separated locations accordingly. As previously discussed in FIG. 3A to FIG. 3B, a material of the second patch layer 18 can be a silicon derivative material, such as silicon oxide ($SiO_2$), silicon carbide (SiC), or other material that is capable of absorbing EUV.

Figure 5A:
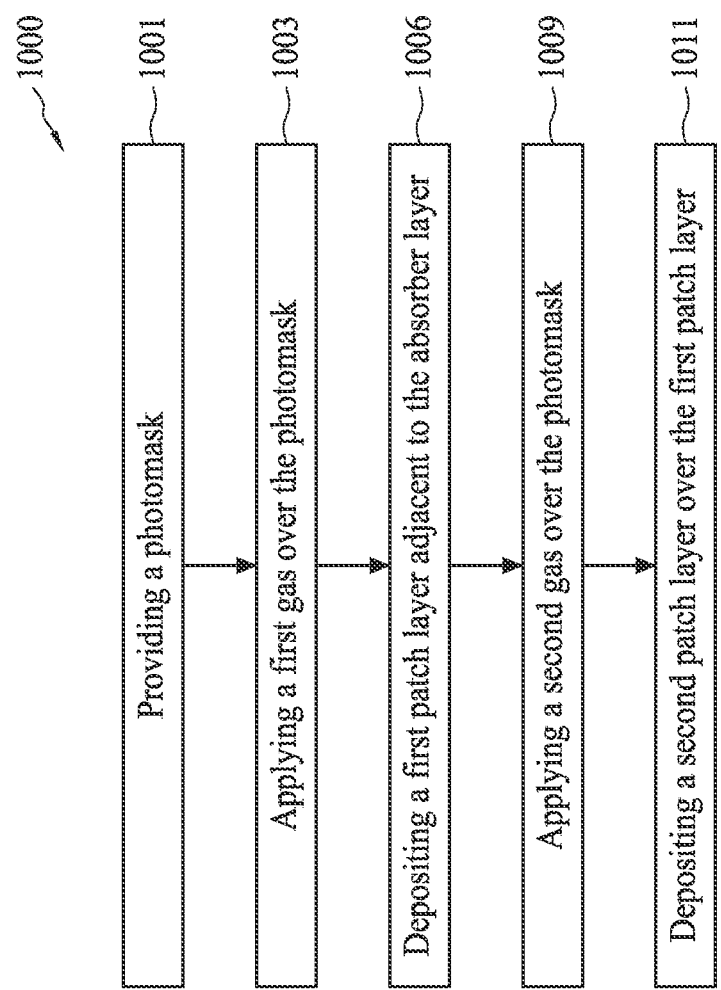
FIG. 5A shows a flow chart representing a method for repairing a photomask, in accordance with some embodiments of the present disclosure.

Referring to FIG. 5A, FIG. 5A shows a flow chart representing a method for repairing a photomask, in accordance with some embodiments of the present disclosure. The method 1000 for repairing a photomask includes providing a photomask (operation 1001, which can be referred to FIG. 6 or FIG. 10D), applying a first gas over the photomask (operation 1003, which can be referred to FIG. 7A or FIG. 10E), depositing a first patch layer adjacent to the absorber layer (operation 1006, which can be referred to FIG. 7A to FIG. 7B, or FIG. 10E), applying a second gas over the photomask (operation 1009, which can be referred to FIG.

Figure 7A:
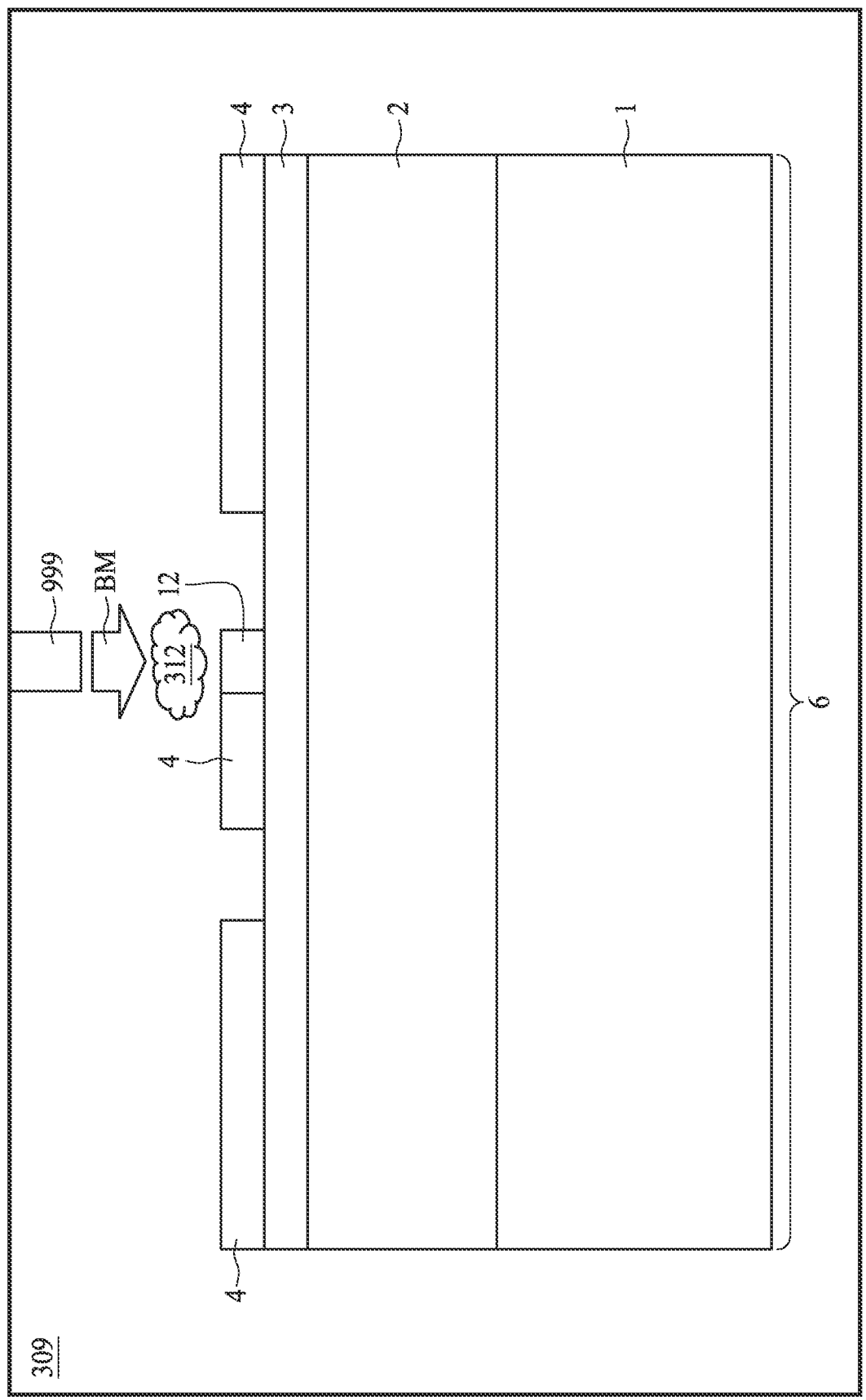
FIG. 7A to 7D are cross sectionals view of a photomask during intermediate repairing operations, according to some embodiments of present disclosure.
Figure 7B:
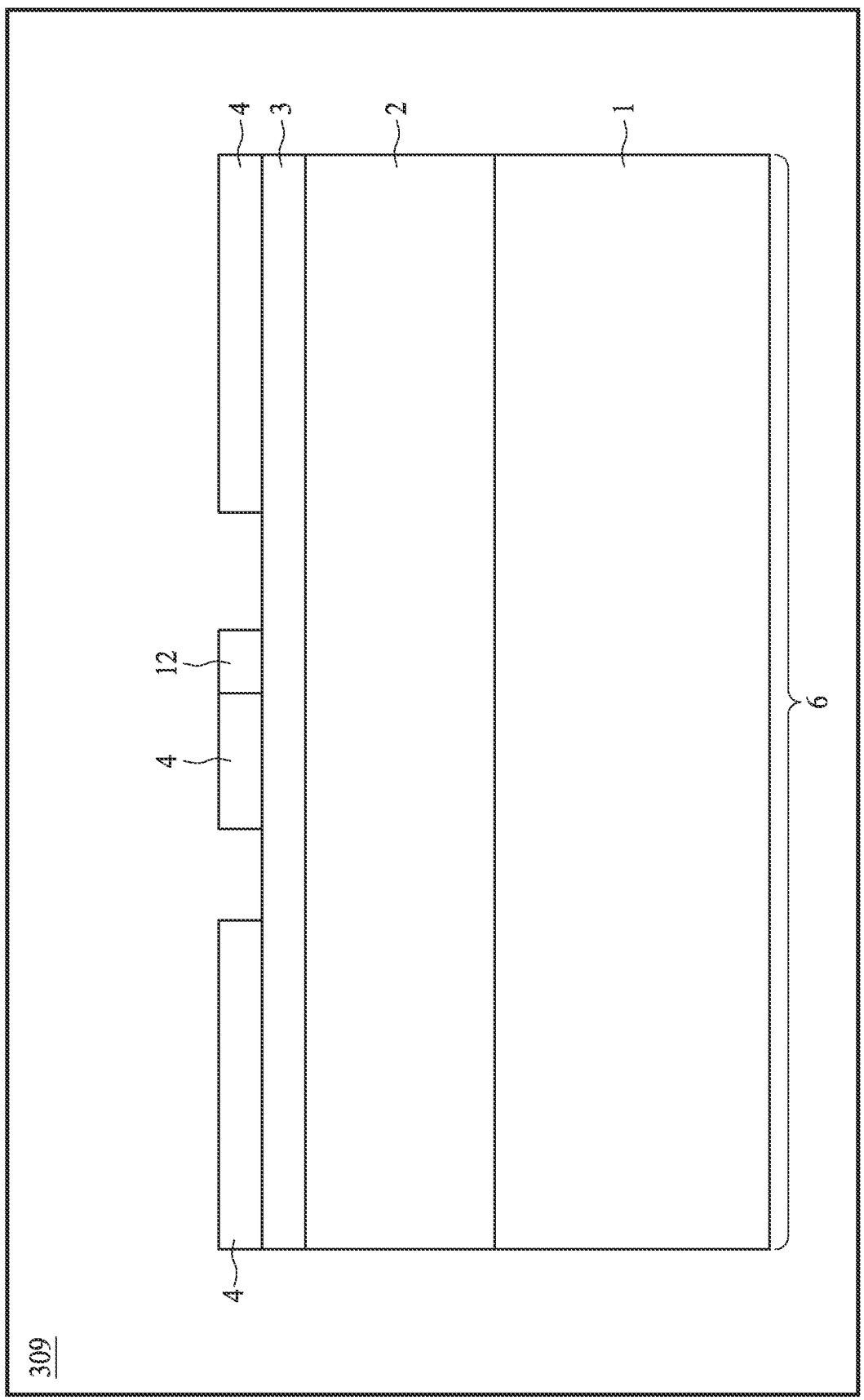
Figure 7C:
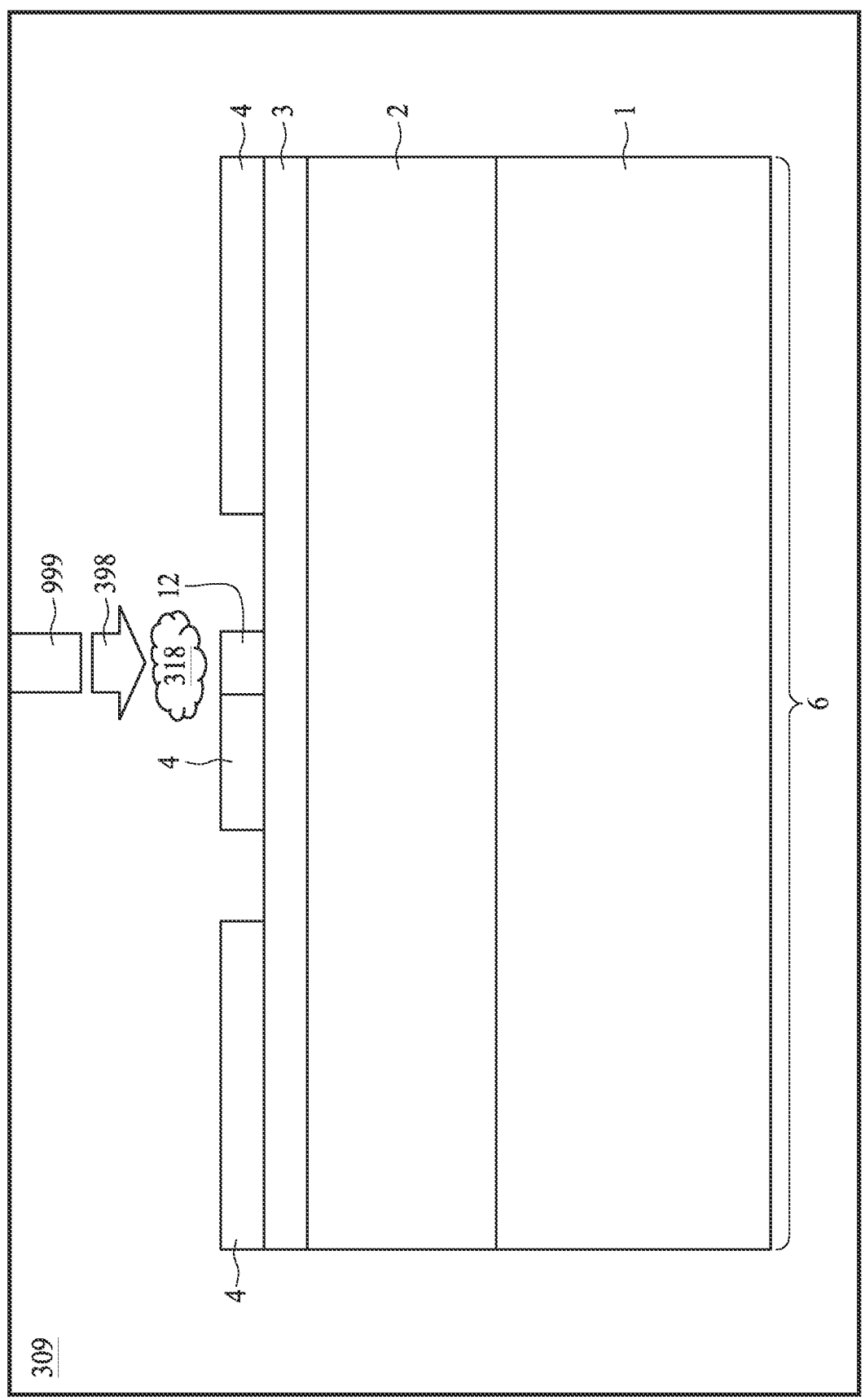
Figure 7D:
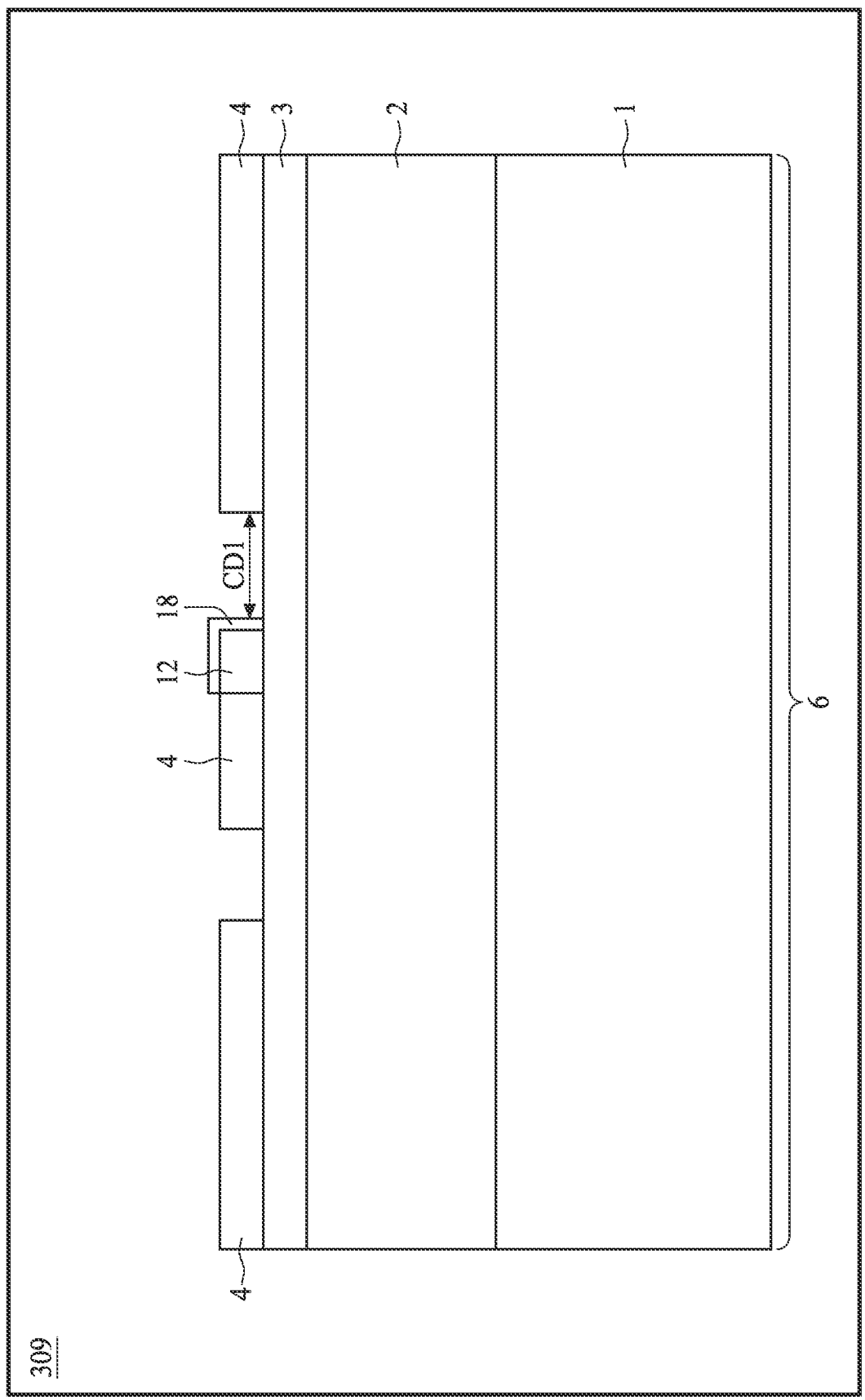
Figure 7A:
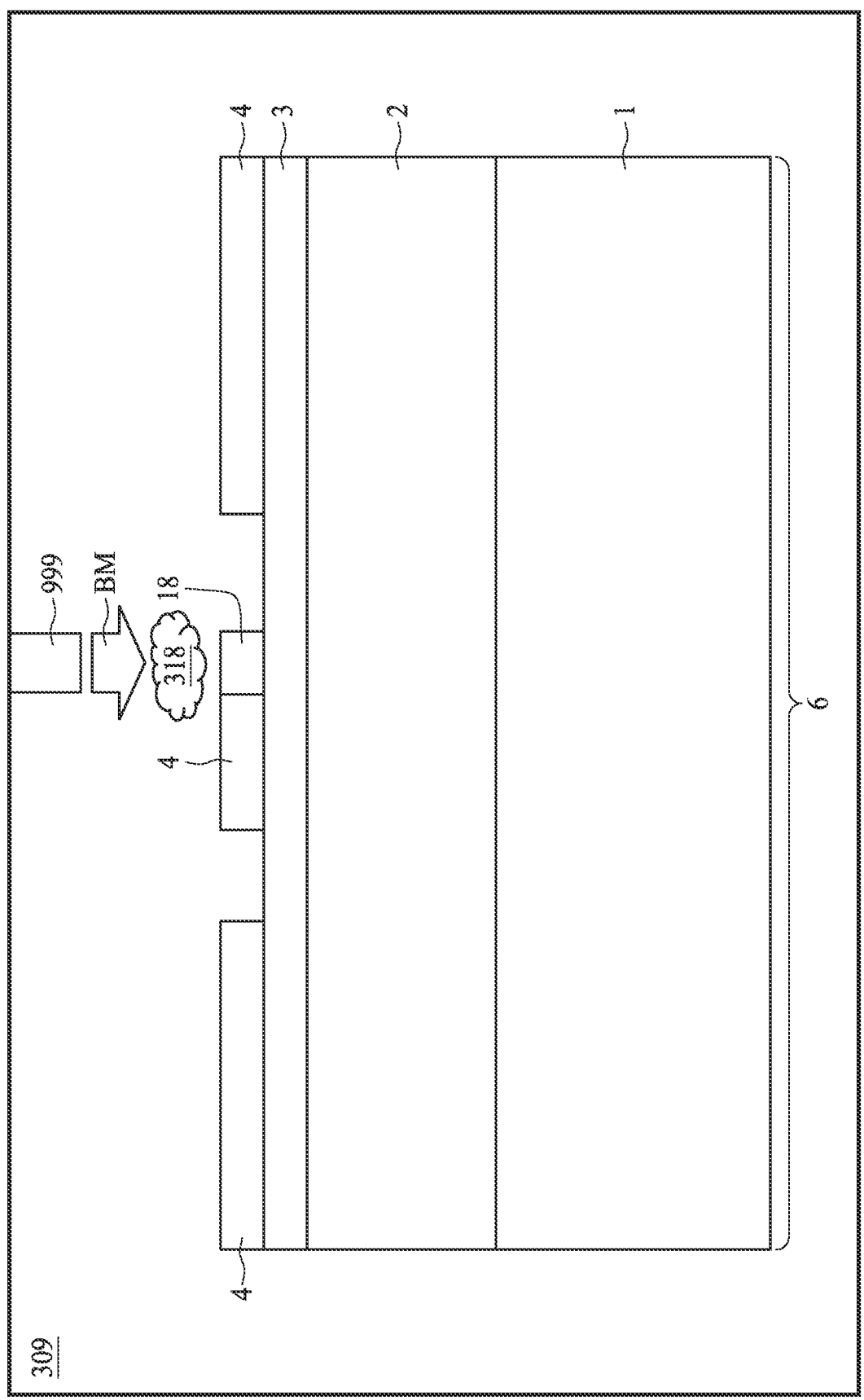
Figure 7B:
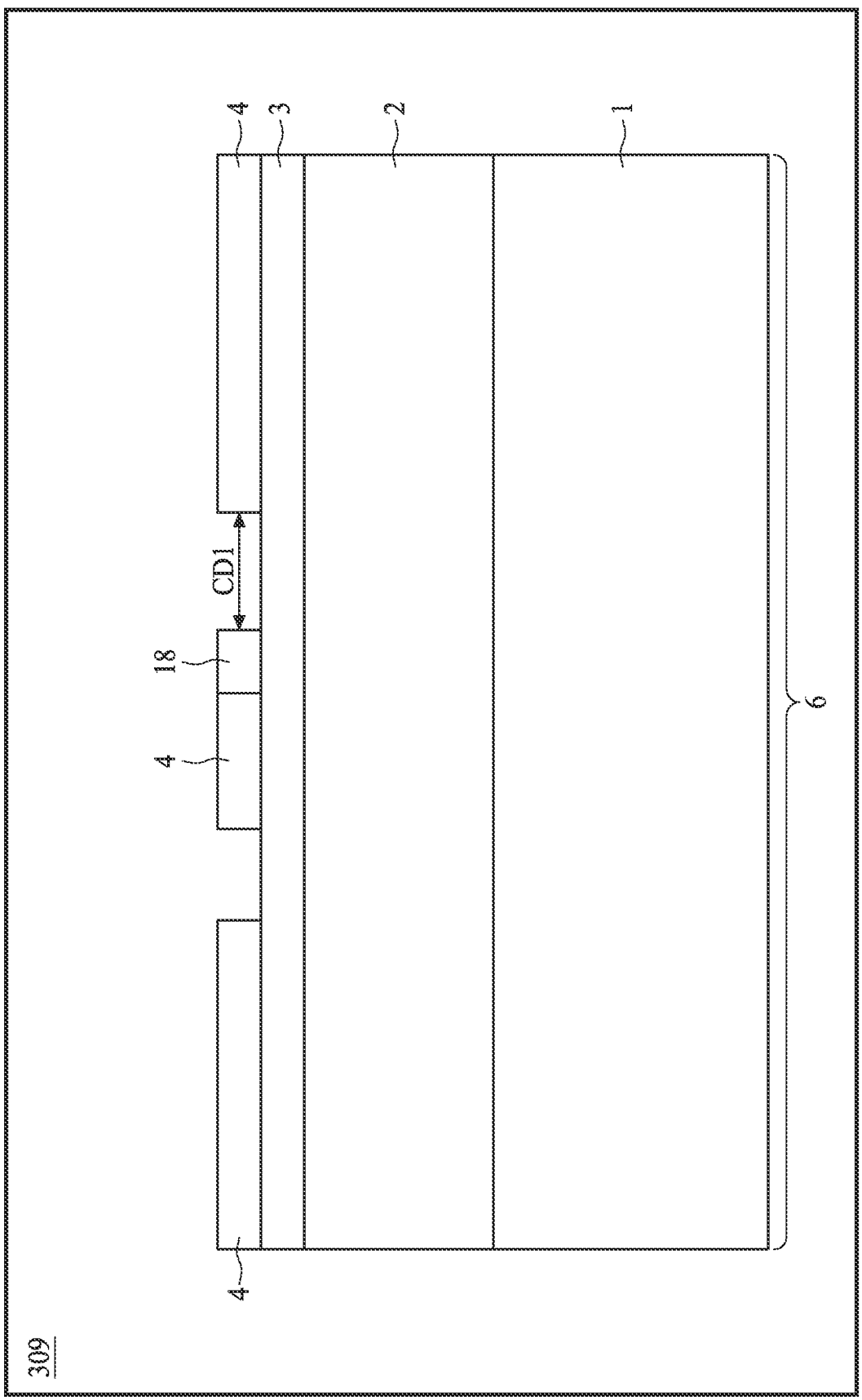
Figure 10A:
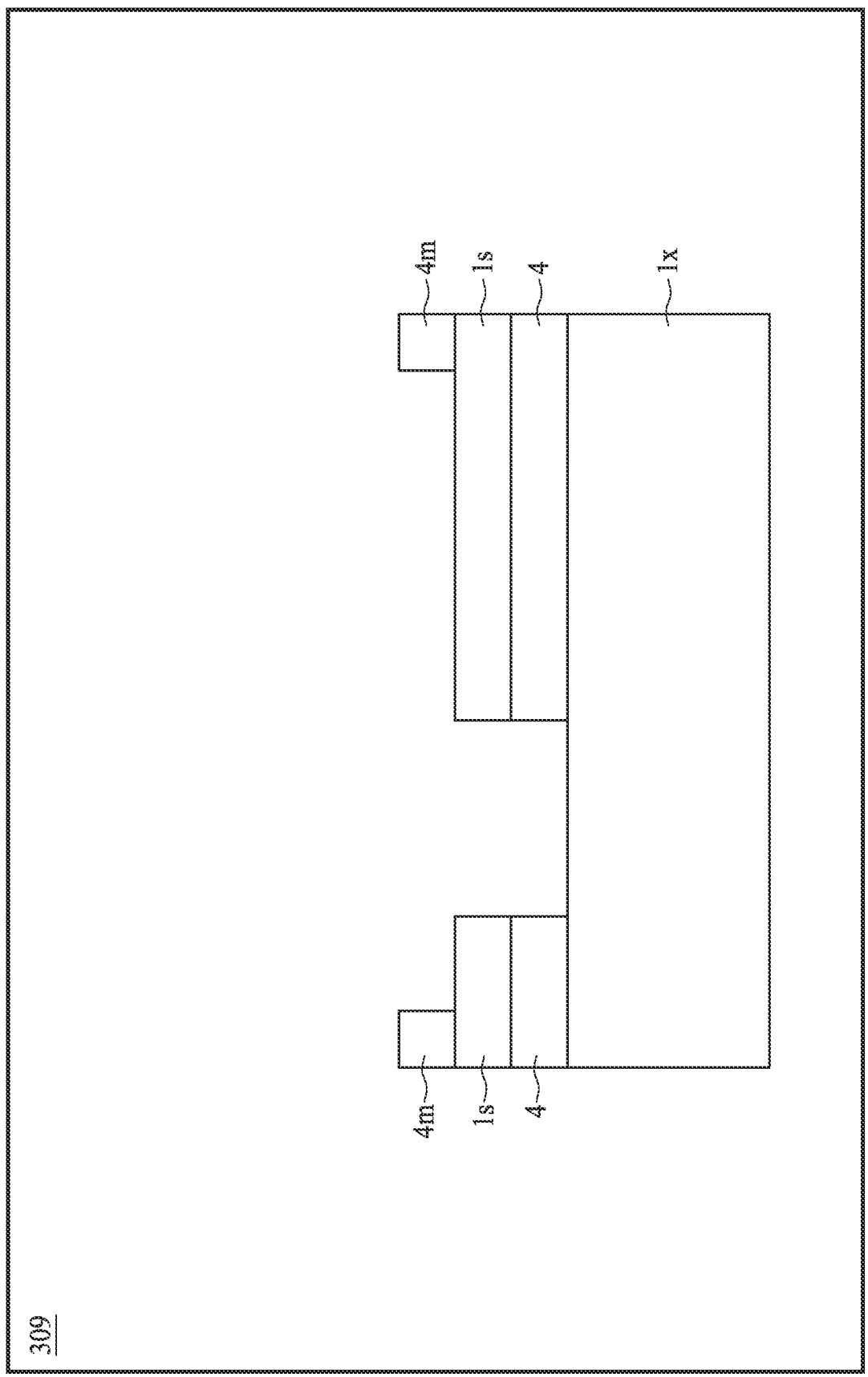
FIG. 10A to 10F are cross sectional views of a photomask during intermediate manufacturing operations, according to some embodiments of present disclosure.
Figure 10B:
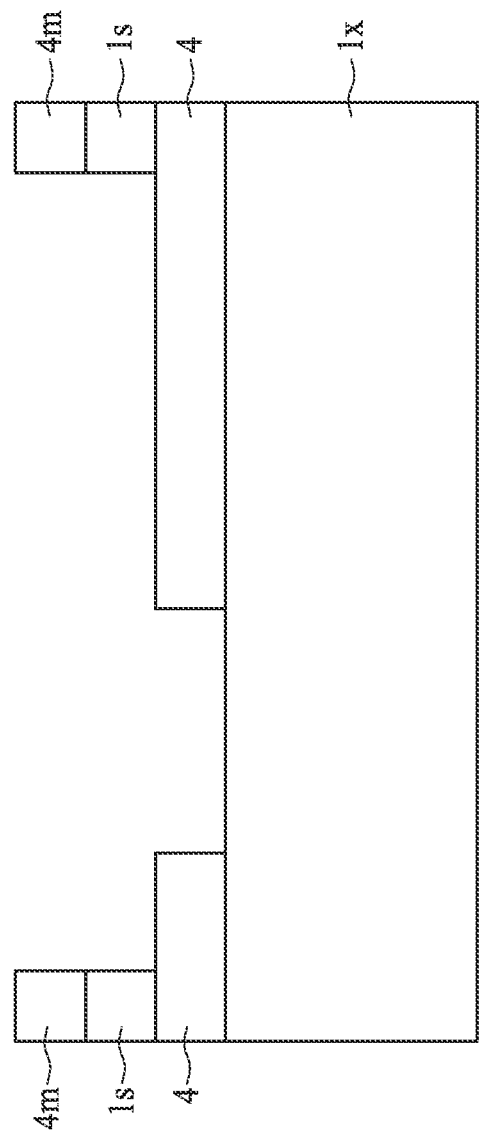
Figure 10C:
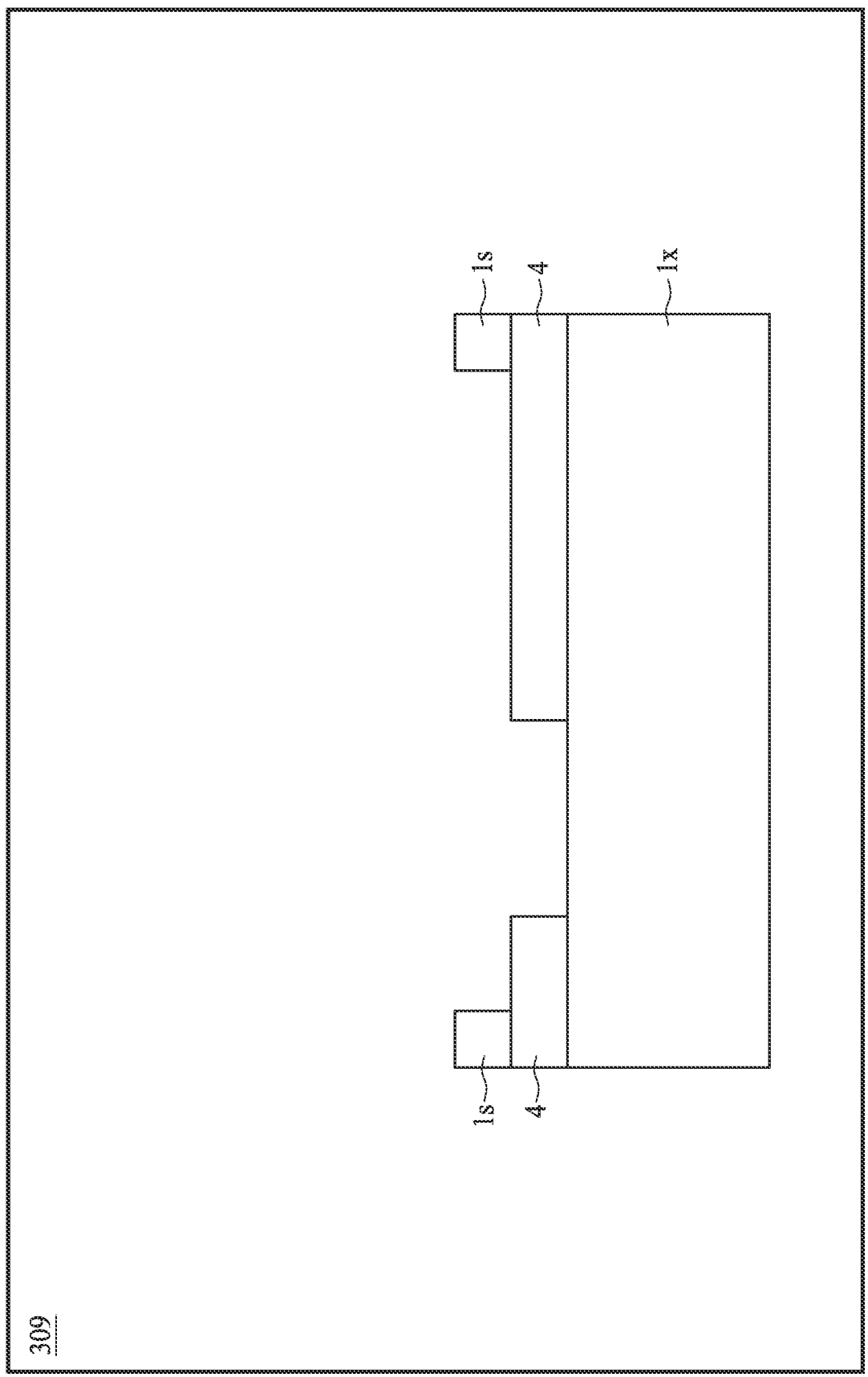
Figure 10D:
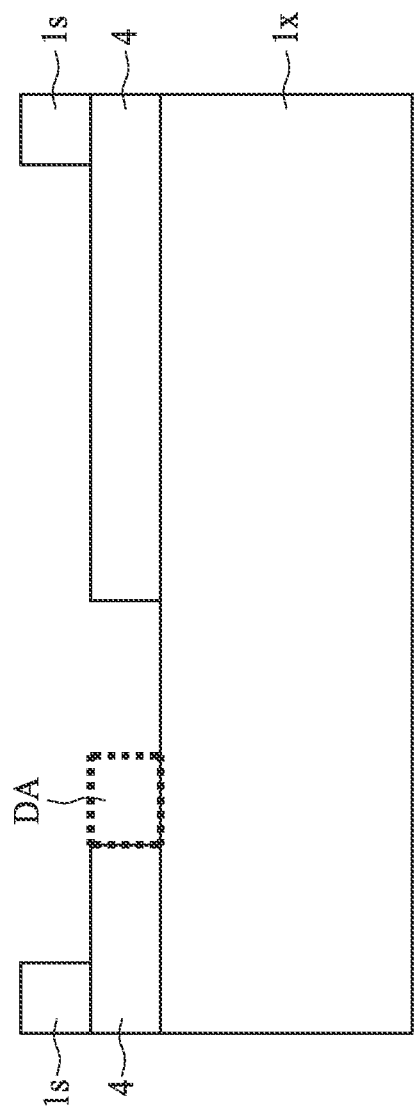
Figure 10E:
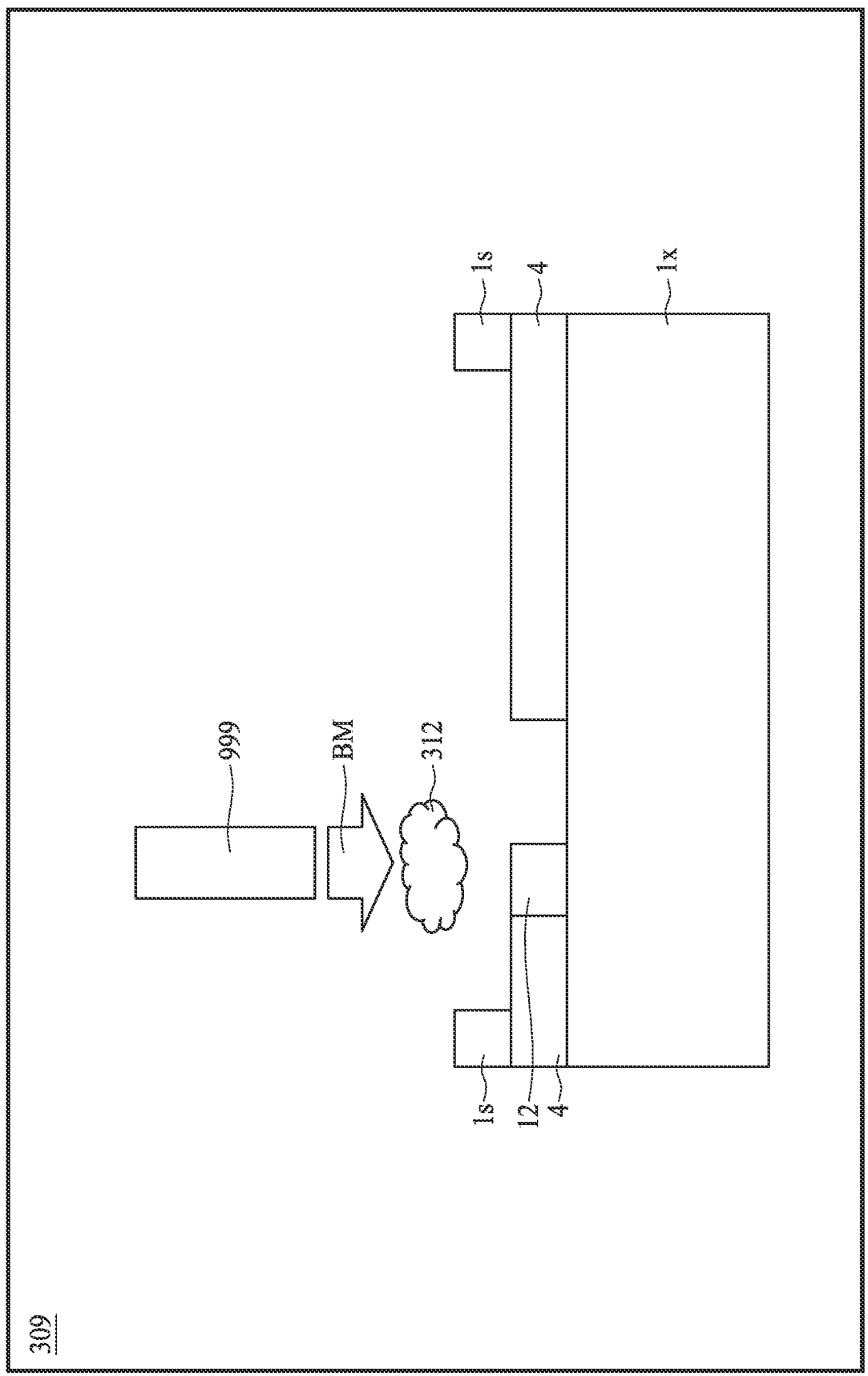
Figure 10F:
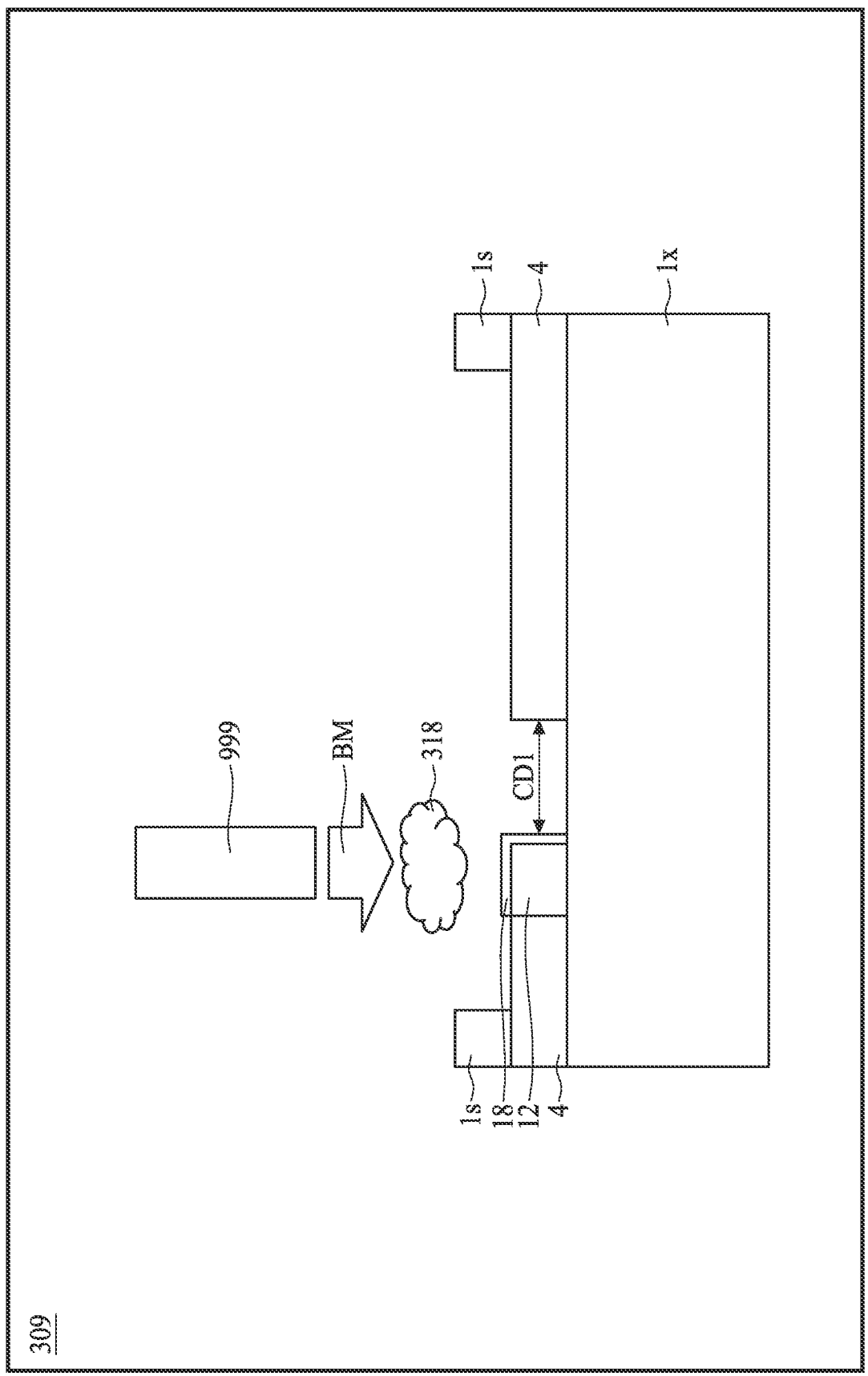

7C or FIG. 10F), and depositing a second patch layer over the first patch layer (operation 1011, which can be referred to FIG. 7C to FIG. 7D, or FIG. 10F).

Figure 5B:
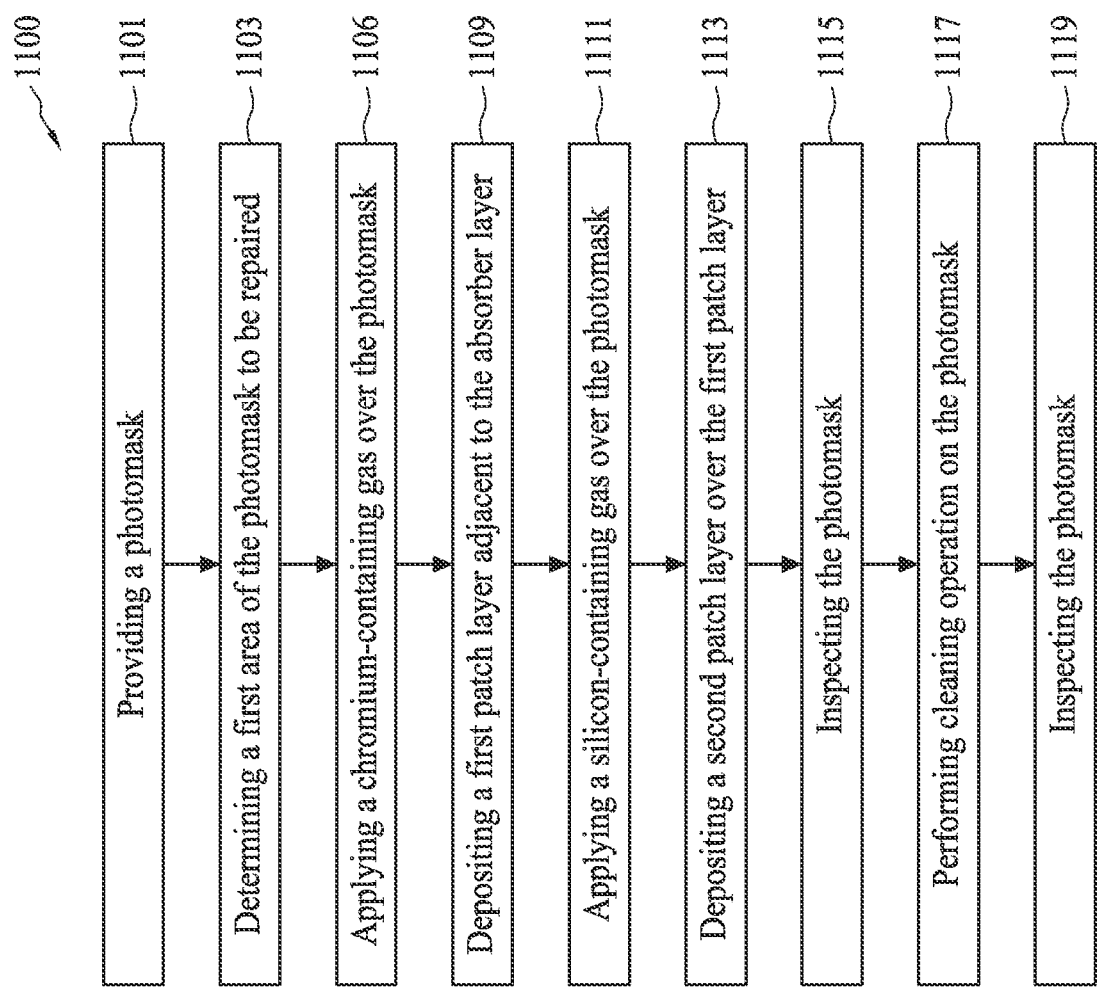
FIG. 5B shows a flow chart representing a method for repairing a photomask, in accordance with some embodiments of the present disclosure.

Referring to FIG. 5B, FIG. 5B shows a flow chart representing a method for repairing a photomask, in accordance with some embodiments of the present disclosure. The method 1100 for fabricating a photomask includes providing a photomask (operation 1101, which can be referred to FIG. 6 or FIG. 10D), determining a first area of the photomask to be repaired (operation 1103, which can be referred to FIG. 6) or FIG. 10D, applying a chromium-containing gas over the photomask (operation 1106, which can be referred to FIG. 7A or FIG. 10E), depositing a first patch layer adjacent to the absorber layer (operation 1109, which can be referred to FIG. 7A to FIG. 7B, or FIG. 10E), applying a silicon-containing gas over the photomask (operation 1111, which can be referred to FIG. 7C or FIG. 10F), depositing a second patch layer over the first patch layer (operation 1113, which can be referred to FIG. 7C to FIG. 7D, or FIG. 10F), inspecting the photomask (operation 1115, which can be referred to FIG. 7D or FIG. 10F), performing cleaning operation on the photomask (operation 1117, which can be referred to FIG. 11 to FIG. 14), and inspecting the photomask (operation 1119, which can be referred to FIG. 15A, FIG. 15B or FIG. 15C).

Figure 5C:
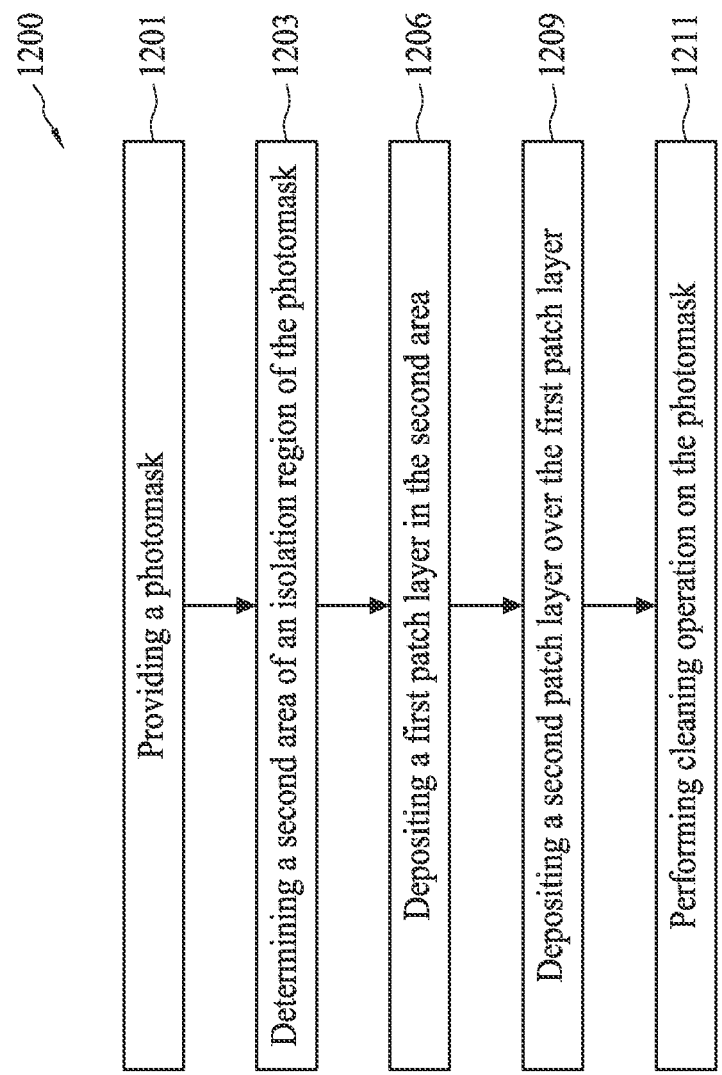
FIG. 5C shows a flow chart representing a method for repairing a photomask, in accordance with some embodiments of the present disclosure.

Referring to FIG. 5C, FIG. 5C shows a flow chart representing a method for repairing a photomask, in accordance with some embodiments of the present disclosure. The method 1200 for fabricating a photomask includes providing a photomask (operation 1201, which can be referred to FIG. 8), determining a second area of an isolation region of the photomask (operation 1203, which can be referred to FIG. 8), depositing a first patch layer in the second area (operation 1206, which can be referred to FIG. 9A to FIG. 9B), depositing a second patch layer over the first patch layer (operation 1209, which can be referred to FIG. 9C), and performing cleaning operation on the photomask (operation 1211, which can be referred to FIG. 11 to FIG. 14).

Figure 5D:
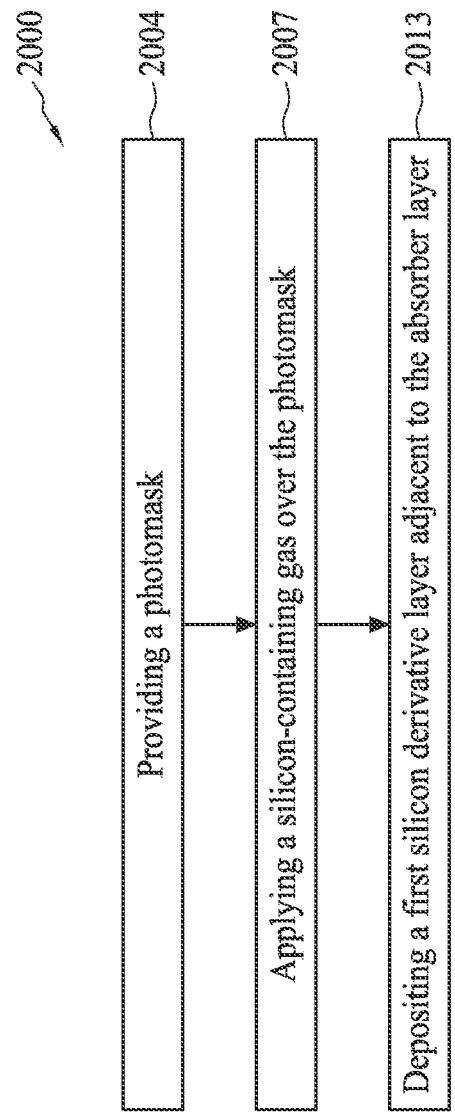
FIG. 5D shows a flow chart representing a method for repairing a photomask, in accordance with some embodiments of the present disclosure.

Referring to FIG. 5D, FIG. 5D shows a flow chart representing a method for repairing a photomask, in accordance with some embodiments of the present disclosure. The method 2000 for fabricating a photomask includes providing a photomask (operation 2004, which can be referred to FIG. 6), applying a silicon-containing gas over the photomask (operation 2007, which can be referred to FIG. 7A'), and depositing a first silicon derivative layer adjacent to the absorber layer (operation 2013, which can be referred to FIG. 7A' to FIG. 7B').

Figure 5E:
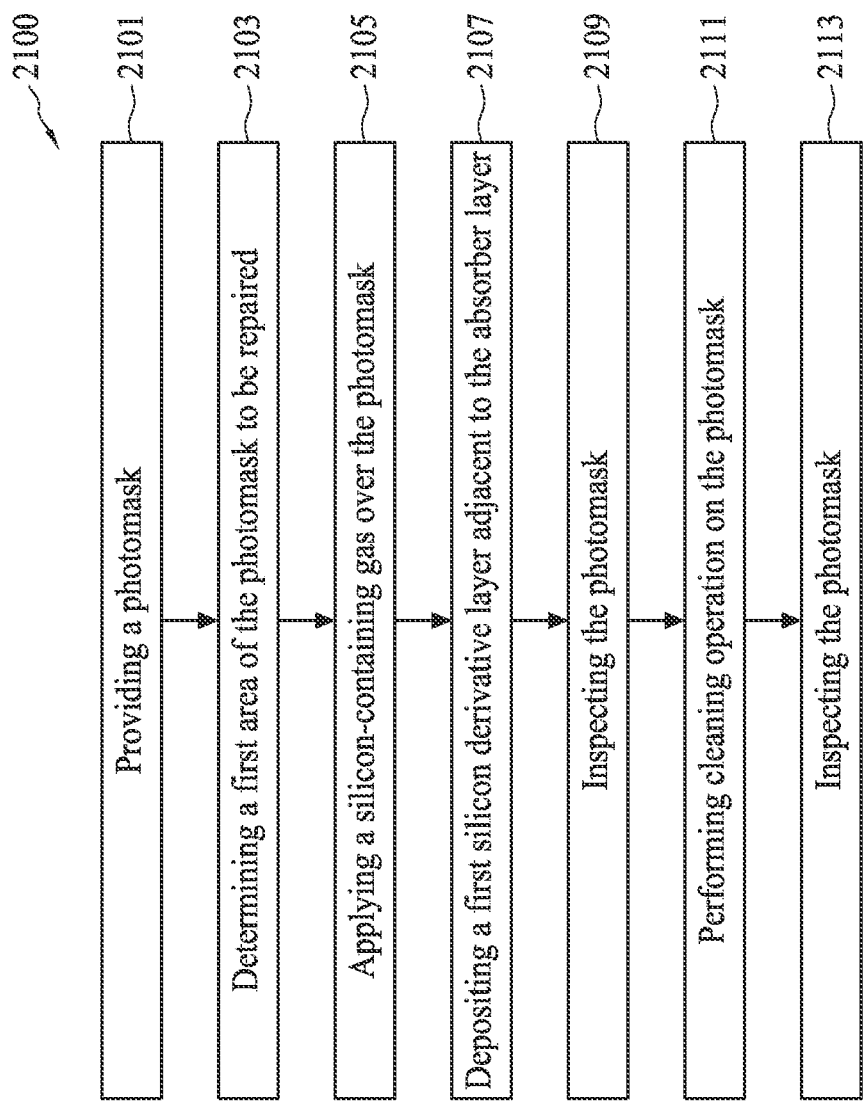
FIG. 5E shows a flow chart representing a method for repairing a photomask, in accordance with some embodiments of the present disclosure.

Referring to FIG. 5E, FIG. 5E shows a flow chart representing a method for repairing a photomask, in accordance with some embodiments of the present disclosure. The method 2100 for fabricating a photomask includes providing a photomask (operation 2101, which can be referred to FIG. 6), determining a first area of the photomask to be repaired (operation 2103, which can be referred to FIG. 6), applying a silicon-containing gas over the photomask (operation 2105, which can be referred to FIG. 7A'), depositing a first silicon derivative layer adjacent to the absorber layer (operation 2107, which can be referred to FIG. 7A' to FIG. 7B'), inspecting the photomask (operation 2109, which can be referred to FIG. 7B'), performing cleaning operation on the photomask (operation 2111, which can be referred to FIG. 11 to FIG. 14), and inspecting the photomask (operation 2209, which can be referred to FIG. 15A, FIG. 15B or FIG. 15C).

Figure 5F:
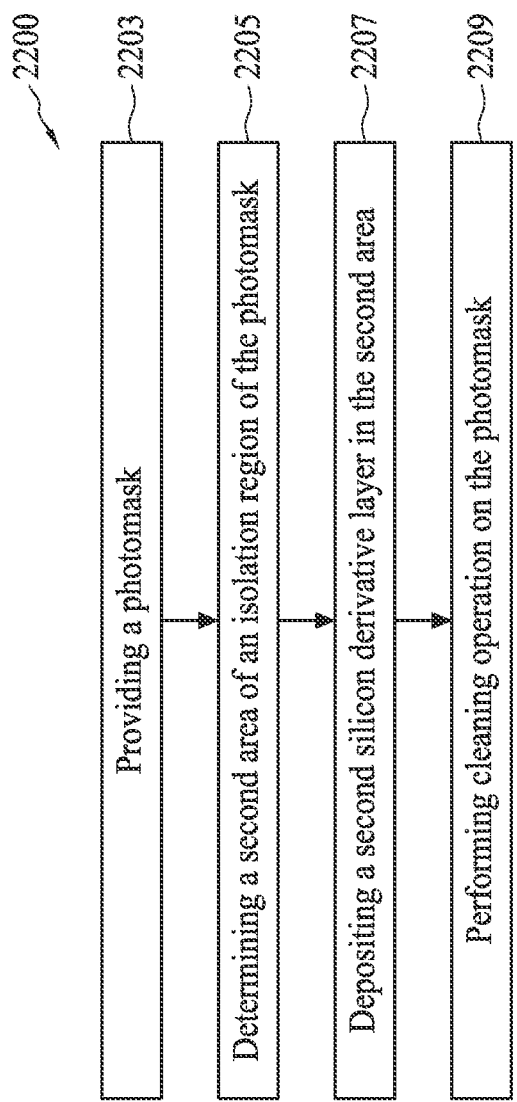
FIG. 5F shows a flow chart representing a method for repairing a photomask, in accordance with some embodiments of the present disclosure.

Referring to FIG. 5F, FIG. 5F shows a flow chart representing a method for repairing a photomask, in accordance with some embodiments of the present disclosure. The method 2200 for fabricating a photomask includes providing a photomask (operation 2203, which can be referred to FIG. 8), determining a second area of an isolation region of the photomask (operation 2205, which can be referred to FIG. 8), depositing a second silicon derivative layer in the second area (operation 2207, which can be referred to FIG. 9A'), and performing cleaning operation on the photomask (operation 2209, which can be referred to FIG. 11 to FIG. 14).

Figure 5G:
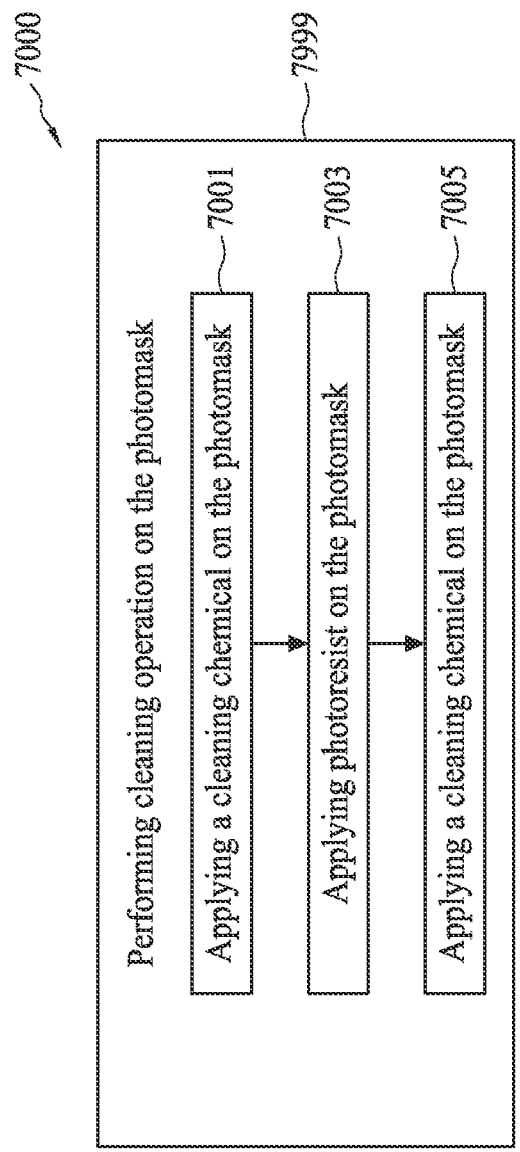
FIG. 5G shows a flow chart representing a method for cleaning a photomask, in accordance with some embodiments of the present disclosure.

Referring to FIG. 5G, FIG. 5G shows a flow chart representing a method for cleaning a photomask, in accordance with some embodiments of the present disclosure. The method 7000 for cleaning a photomask includes performing cleaning operation on a photomask (operation 7999). The operation 7999 includes applying a cleaning chemical on the photomask (sub-operation 7001, which can be referred to FIG. 11), applying photoresist on the photomask (sub-operation 7003, which can be referred to FIG. 12), and applying a cleaning chemical on the photomask (sub-operation 7005, which can be referred to FIG. 13).

Figure 6:
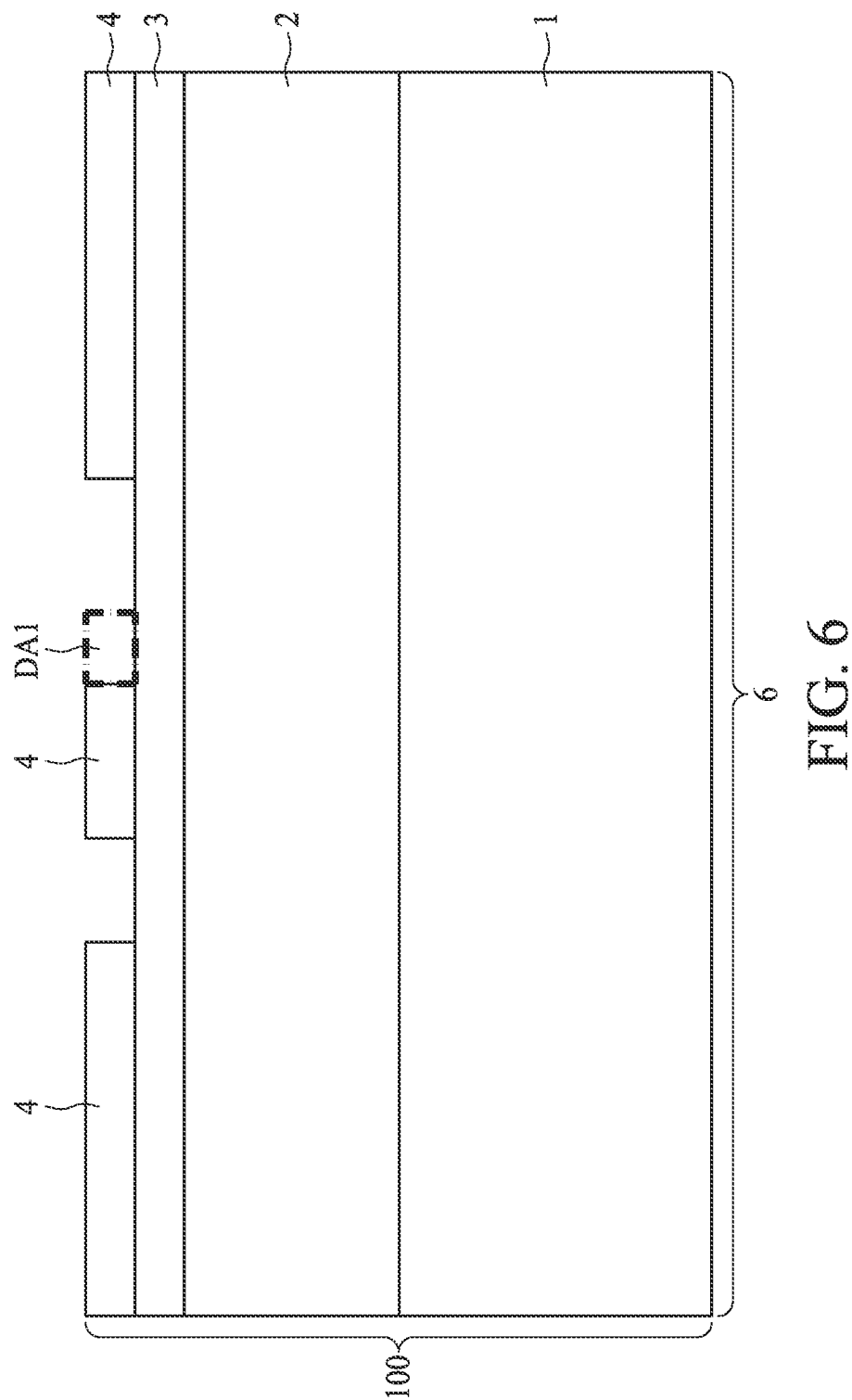
FIG. 6 is a cross sectional view of a photomask during intermediate repairing operations, according to some embodiments of present disclosure.
Figure 8:
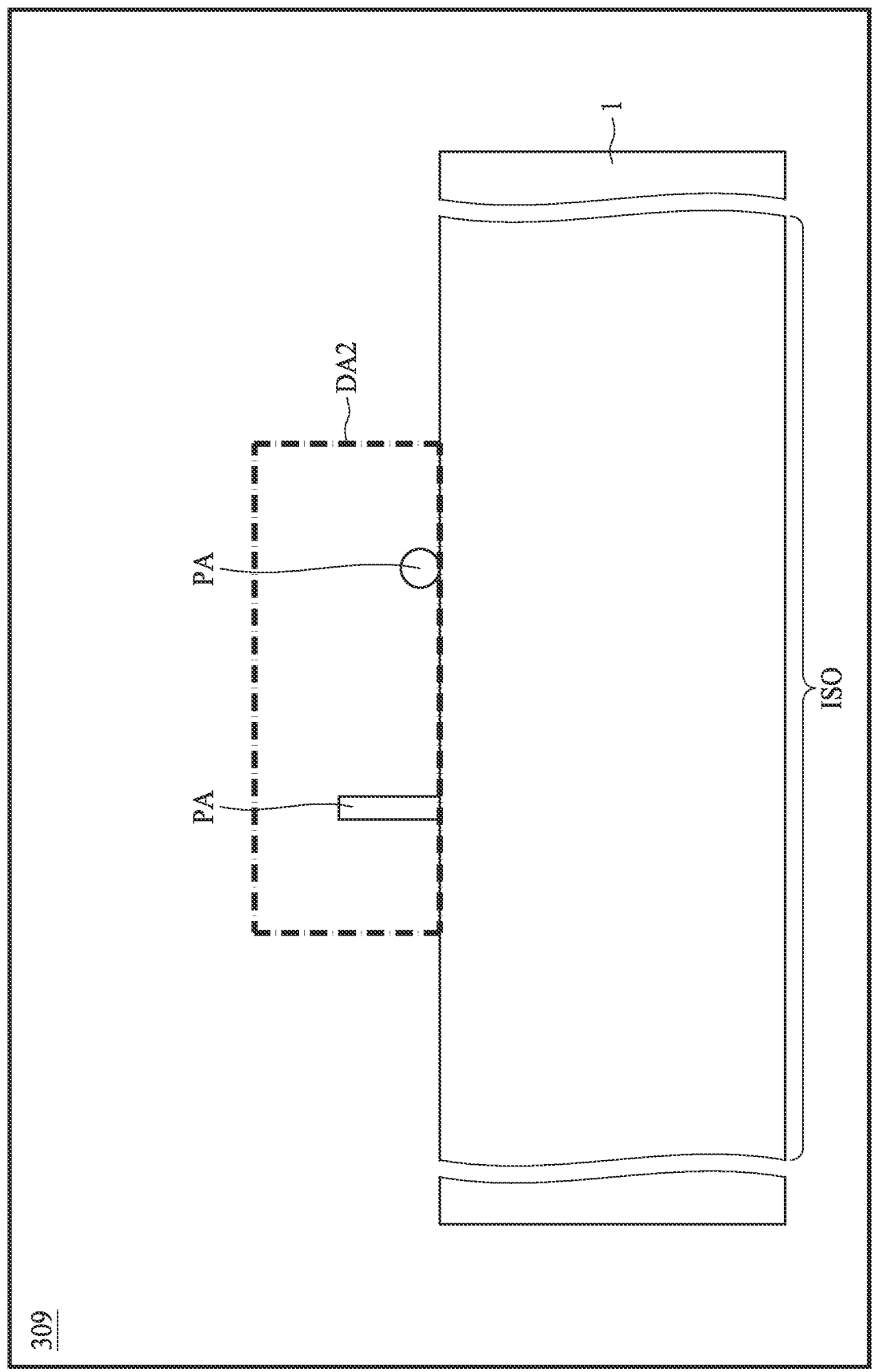
FIG. 8 is a cross sectional view of a photomask during intermediate repairing operations, according to some embodiments of present disclosure.
Figure 9A:
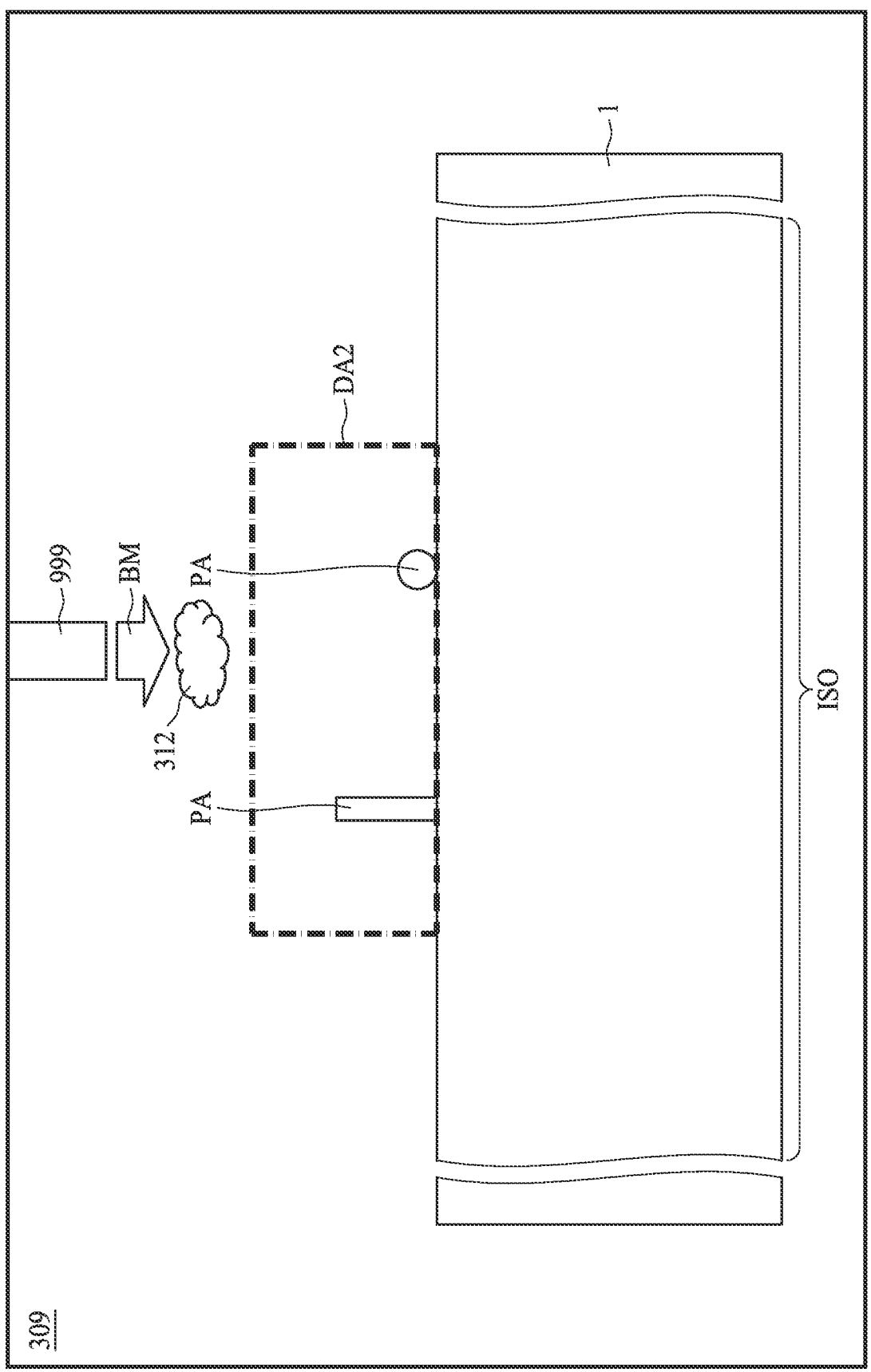
FIG. 9A to 9C are cross sectional views of a photomask during intermediate repairing operations, according to some embodiments of present disclosure.
Figure 9B:
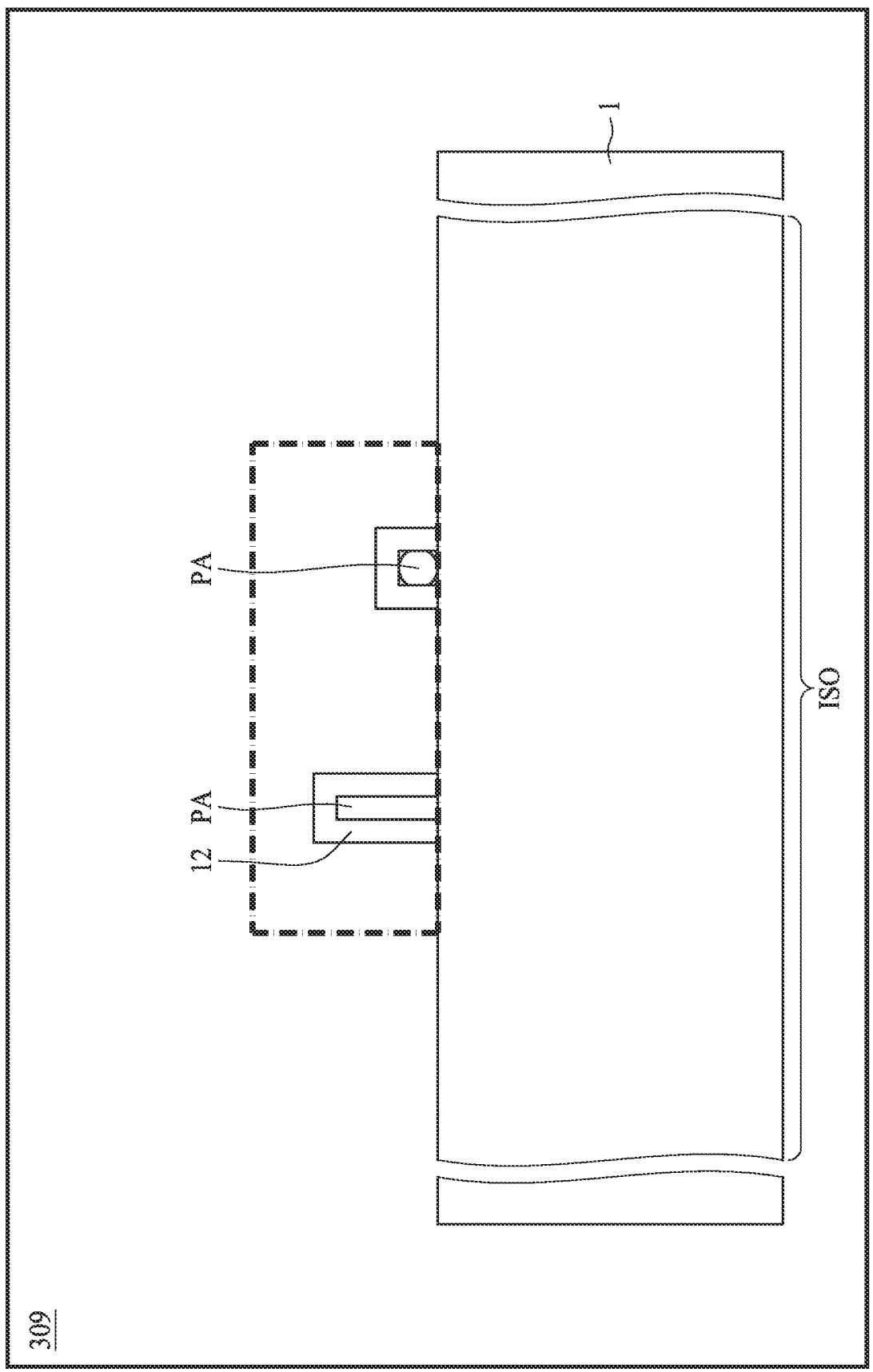
Figure 9C:
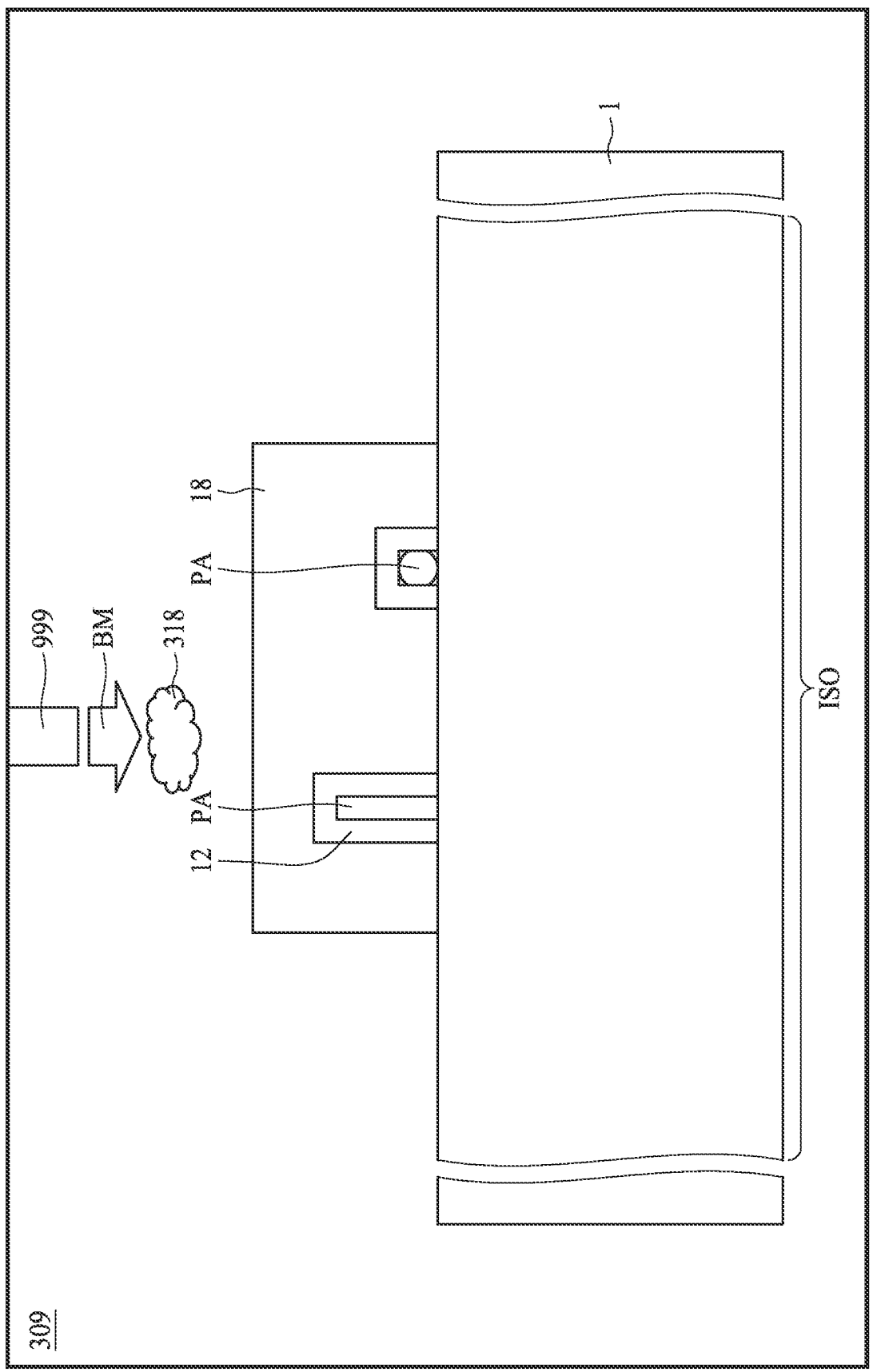
Figure 9A:
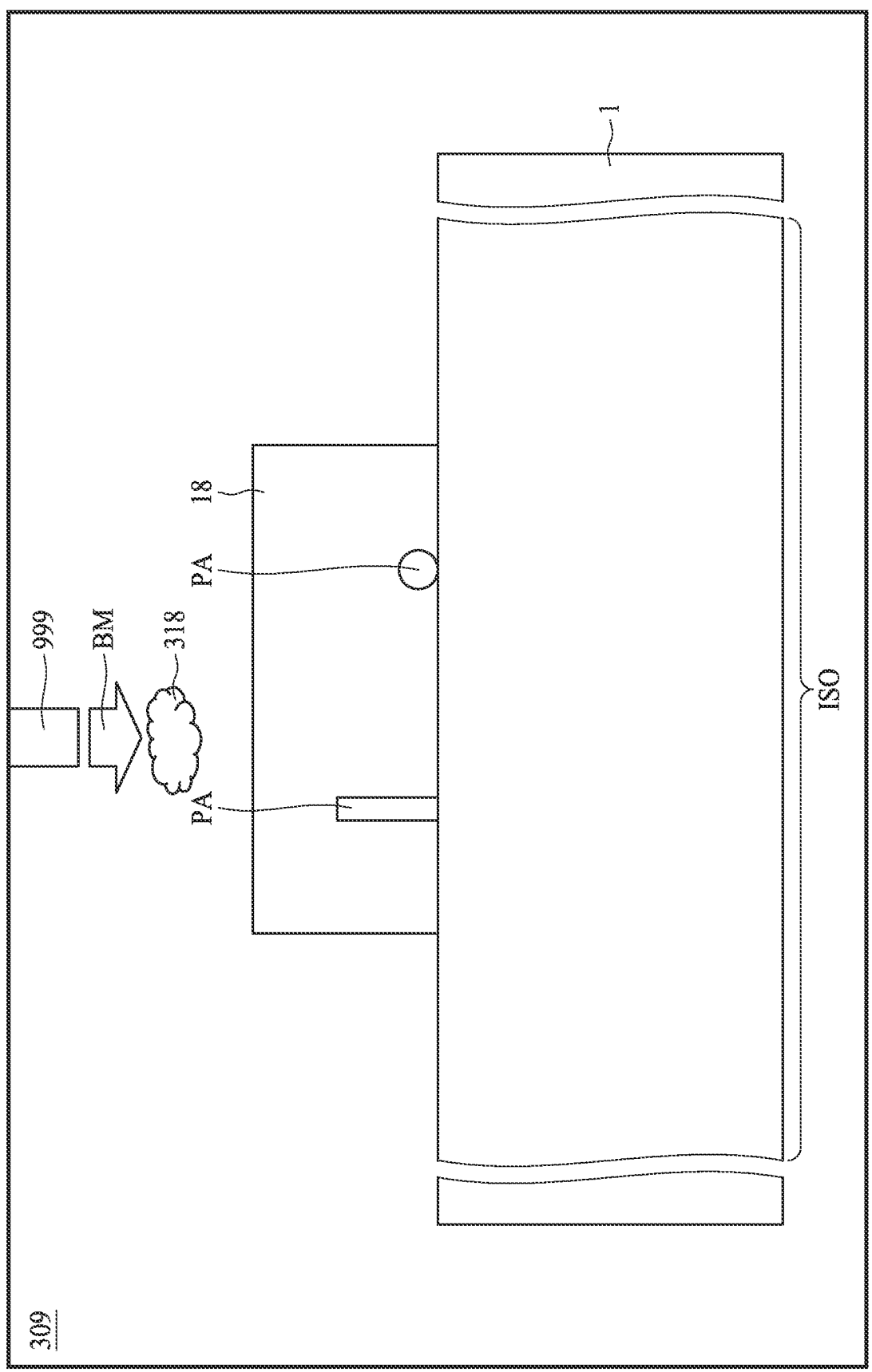

FIG. 6 and FIG. 7A to FIG. 7D provide a method for repairing a pattern region 6 of the photomask 100; FIG. 6 and FIG. 7A' to FIG. 7B' provide another method for repairing a pattern region 6 of the photomask 100y. FIG. 8 and FIG. 9A to FIG. 9C provide a method for repairing an isolation region ISO of the photomask 100 or photomask 100y; FIG. 8 and FIG. 9A' provide another method for repairing an isolation region ISO of the photomask 100y or photomask 100. FIG. 10A to FIG. 10F provide another method for repairing a photomask 100x. The repairing operation in the present disclosure can be performed after manufacturing a photomask and before performing a lithography operation using the photomask, or, after performing cycle(s) of lithography operation(s) using the photomask.

Referring to FIG. 6, FIG. 6 is a cross sectional view of a photomask during intermediate repairing operations, according to some embodiments of present disclosure. A photomask 100 as discussed in FIG. 1A to FIG. 2D is provided. In order to obtain a pattern of the absorber layer 4 of a fabricated photomask 100 similar to a predetermined pattern, an inspection operation is performed on the photomask 100. The defect may include, but not limited to, an absence of a desired photomask feature, a damaged or absent scattering bar, an absence of material from a larger pattern feature, or any undesirable material loss of the photomask. For example, the pattern of the fabricated photomask 100 may be compared to a predetermined layout design, thereby identify the defect of fabricated photomask 100 that is different from the original desirable design. For another example, the defect of the fabricated photomask 100 may also be identified by experience or by algorithm. As shown in FIG. 6, a first predetermined area DA1 having a defect is identified.

Referring to FIG. 7A and FIG. 7B, FIG. 7A is a cross sectional view of a photomask during intermediate repairing operations, FIG. 7B is a cross sectional view of a photomask during intermediate repairing operations, according to some embodiments of present disclosure. In order to repair or mitigate the defect, after inspecting the defect thereon, the fabricated photomask 100 is positioned in a repair chamber 309. A first gas 312 is introduced into the repair chamber 309 and applied on the photomask 100. The first gas 312 is a precursor for forming a first patch layer 12. The first gas 312 may be a metal-containing gas, such as a chromium-containing gas which can serve as a precursor for forming a chromium-containing layer. For example, the first gas 312 may include $Cr(CO)_6$, $Cr(C_6H_6)_2$, $Cr(C_5H_5)_2$, $CrF_2$, $CrCl_2$, $CrCl_3$, the combination thereof, or the like. Furthermore, the repair chamber 309 includes a repair tool 999 configured to emit beam BM (which can be electron beam (e-beam), laser, ion beam, or the like) over a predetermined area. The beam BM may disassociate bonding of the first gas 312, thus a solid material can be formed in the predetermined area in a localized manner. The beam BM can optionally be radiating in a fixed manner or a scanning manner. For example, in the case of the first gas 312 is a chromium-containing gas, by having the beam 392 irradiated over the first predetermined area DA1 (shown in FIG. 6), a chromium-containing first patch layer 12 can be locally formed in the first predetermined area DAL. In some embodiments, the first predetermined area DA1 is adjacent to a sidewall of the absorber layer 4, and the formed first patch layer 12 is in direct contact with the sidewall of the absorber layer 4, as shown in FIG. 7B. In some embodiments, a thickness of the first patch layer 12 is comparable to a thickness of the absorber layer 4. The first gas 312 is exhausted from the repair chamber 309 after deposition of the first patch layer 12.

Referring to FIG. 7C and FIG. 7D, FIG. 7C is a cross sectional view of a photomask during intermediate repairing operations, FIG. 7D is a cross sectional view of a photomask during intermediate repairing operations, according to some embodiments of present disclosure. Subsequently, a second gas 318 is introduced into the repair chamber 309 and applied on the photomask 100. The second gas 318 is a precursor for forming a second patch layer 18. The second gas 318 may be a silicon-containing gas which can serve as a precursor for forming a silicon derivative layer. For example, the second gas 318 may be at least one of the $SiH_4$, $SiCl_4$, $(CH_3O)_4Si$, $(C_2H_5O)_4Si$, $(CH_4SiO)_4$, $(CH_4SiO)_5$, the combination thereof, or the like. Furthermore, the repair tool 999 of the repair chamber 309 may emit beam BM over a predetermined area, thus the silicon derivative layer may form locally in such predetermined area. Optionally, the second gas 318 can be exhausted from the repair chamber 309 after deposition of the second patch layer 18. In some embodiments, the formed second patch layer 18 entirely covers an exposed portion of the first patch layer 12. In some embodiments, a thickness of the second patch layer 18 over the sidewall of the first patch layer 12 is thinner than a thickness of the second patch layer 18 over the top surface of the first patch layer 12. In order to serve as a baseline of whether the second patch layer 18 can effectively prevent material loss thereof or material loss of the first patch layer 12 during a subsequent cleaning operation (as will be discussed in FIG. 11 to FIG. 14), a first critical dimension CD1 of a selected mask feature adjacent to the second patch layer 18 (or the first predetermined area DA1) is measured.

Referring to FIG. 7A' and FIG. 7B', FIG. 7A' is a cross sectional view of a photomask during intermediate repairing operations, FIG. 7B' is a cross sectional view of a photomask during intermediate repairing operations, according to some embodiments of present disclosure. After identifying a first predetermined area DA1 having a defect as discussed in FIG. 6, a second gas 318 (similar to the counterpart discussed in FIG. 7C to FIG. 7D) is introduced into the repair chamber 309 and applied on the photomask 100. By irradiating the beam BM over the first predetermined area DA1, the second patch layer 18 is locally deposited in the first predetermined area DA1. Optionally, the second gas 318 can be exhausted from the repair chamber 309 after deposition of the second patch layer 18. In some embodiments, the first predetermined area DA1 is adjacent to a sidewall of the absorber layer 4, and the formed second patch layer 18 is in direct contact with the sidewall of the absorber layer 4, as shown in FIG. 7B'. In some embodiments, a thickness of the second patch layer 18 is comparable to a thickness of the absorber layer 4. In order to serve as a baseline of whether the second patch layer 18 can effectively prevent material loss thereof during a subsequent cleaning operation (as will be discussed in FIG. 11 to FIG. 14), a first critical dimension CD1 of a selected mask feature adjacent to the second patch layer 18 (or the first predetermined area DA1) is measured. It should be noted that in the case of a material of the second patch layer 18 can absorb light having other wavelength, such as 193 nm light, the aforesaid procedure in FIG. 7A' can also be applied to the photomask 100x.

Referring to FIG. 8, FIG. 8 is a cross sectional view of a photomask during intermediate repairing operations, according to some embodiments of present disclosure. A photomask 100 as discussed in FIG. 1A to FIG. 2D, or alternatively photomask 100y as discussed in FIG. 4A to FIG. 4D is provided. In order to alleviate undesirable reflection or deflection form the isolation region ISO, an inspection operation is performed in the isolation region ISO of the photomask 100. The defect may include, but not limited to, particles PA that falls on the isolation region ISO of the photomask 100. Such particles PA may cause undesirable reflections and deteriorate the performance of lithography operation. As shown in FIG. 8, a second predetermined area DA2 having a defect is identified. It should be noted that the distribution of the particles PA may be dispersed in some cases.

Referring to FIG. 8 and FIG. 9A to FIG. 9C, FIG. 9A to FIG. 9C are cross sectionals view of a photomask during intermediate repairing operations, according to some embodiments of present disclosure. Similar to the discussion in FIG. 7A to FIG. 7B, a first gas 312 is introduced into the repair chamber 309 and applied on the photomask 100 (or photomask 100y). And by irradiating the beam BM over the second predetermined area DA2, a first patch layer 12 is locally formed in the isolation region ISO to cover the particles PA in the second predetermined area DA2. The first gas 312 is exhausted from the repair chamber 309, and the second gas 318 is introduced into the repair chamber 309 and applied on the photomask 100. By irradiating the beam BM over the second predetermined area DA2, a second patch layer 18 is locally formed over the first patch layer 12. In some embodiments, the first patch layer 12 is entirely covered and surrounded by the second patch layer 18. By forming the first patch layer 12 and/or the second patch layer 18, a portion of the lithography radiation (such as EUV) irradiated thereon can be absorbed. Accordingly, the reflection of light from in the isolation region ISO during exposure operation can be alleviated.

In some embodiments, due to the constraint of the repair tool 999, a single second predetermined area DA2 may be limited to a certain size (for example, 10 nm by 10 nm from top view). If a single second predetermined area DA2 cannot cover each of the identified particles, then it would be determined that the particles PA will be divided into a plurality of second predetermined areas DA2, and a plurality of second patch layer 18 may be formed, either connected or physically separated. In some embodiments, if the distribution of the particles PA is rather dispersed, then the plurality of second patch layer 18 may be disposed at separated locations accordingly.

Referring to FIG. 9A', FIG. 9A' is a cross sectional view of a photomask during intermediate repairing operations, according to some embodiments of present disclosure. Alternatively, subsequent to identifying a second predetermined area DA2 having a defect (as discussed in FIG. 8), the second gas 318 is introduced into the repair chamber 309 and applied on the photomask 100. By irradiating the beam BM over the second predetermined area DA2, a second patch layer 18 is locally formed over the particles PA. By forming the second patch layer 18, a portion of the lithography radiation (such as EUV) irradiated thereon can be absorbed. Accordingly, the reflection of light from the isolation region ISO during exposure operation can be alleviated.

It should be noted that in the present disclosure, in some embodiments, repairing of the first predetermined area DA1 of the pattern region 6 is prior to repairing of the second predetermined area DA2 of the isolation region ISO. In some other alternative embodiments, repairing of the first predetermined area DA1 of the pattern region 6 is subsequent to repairing of the second predetermined area DA2 of the isolation region ISO. In some other alternative embodiments, repairing of the second predetermined area DA2 of the isolation region ISO can be performed during repairing of the first predetermined area DA1 of the pattern region 6.

In FIG. 10A to FIG. 10F, a portion of the fabrication operation (including repairing) of the photomask 100x as discussed in FIG. 3A to FIG. 3B is provided. Referring to FIG. 10A, FIG. 10A is a cross sectional view of a photomask during intermediate manufacturing operations, according to some embodiments of present disclosure. An absorber layer 4 is formed on a substrate 1x, and a shielding layer 1s is formed above the absorber layer 4 and patterned. Subsequently, the absorber layer 4 is patterned by using the shielding layer 1s as a mask. A mask layer 4m is further formed above the shielding layer 1s.

Referring to FIG. 10B, FIG. 10B is a cross sectional view of a photomask during intermediate manufacturing operations, according to some embodiments of present disclosure. The shielding layer is exposed from the mask layer 4m is removed by etching, thus a portion of the absorber layer 4 is exposed from the shielding layer 1s. Referring to FIG. 10C, FIG. 10C is a cross sectional view of a photomask during intermediate manufacturing operations, according to some embodiments of present disclosure. The mask layer 4m is thereby removed. In some embodiments, the mask layer 4m is removed by stripping.

Referring to FIG. 10D, FIG. 10D is a cross sectional view of a photomask during intermediate manufacturing operations, according to some embodiments of present disclosure. Subsequently, an inspection operation is performed on the photomask 100x to identify a predetermined area DA to be repaired. The defect in the predetermined area DA may include, but not limited to, an absence of a desired photomask feature, an absence of material from a larger pattern feature, or any undesirable material loss of the photomask. For example, the pattern of the fabricated photomask 100x may be compared to a predetermined layout design, thereby identify the defect of fabricated photomask 100x that deviate from the original desirable design. For another example, the defect of the fabricated photomask 100x may also be identified by experience or by algorithm.

Referring to FIG. 10E, FIG. 10E is a cross sectional view of a photomask during intermediate operations of manufacturing operations, according to some embodiments of present disclosure. The first gas 312 is introduced into the repair chamber 309 and applied on the photomask 100x. By irradiating the beam BM over the predetermined area DA, the first patch layer 12 is locally deposited in the predetermined area DA. Optionally, the first gas 312 can be exhausted from the repair chamber 309 after deposition of the first patch layer 12. Referring to FIG. 10F, FIG. 10F is a cross sectional view of a photomask during intermediate operations of manufacturing operations, according to some embodiments of present disclosure. The second gas 318 is introduced into the repair chamber 309 and applied on the photomask 100x. By irradiating the beam BM over the predetermined area DA, the second patch layer 18 is locally deposited over the first patch layer 12, and further covers a sidewall of the first patch layer 12. In some embodiments, the first patch layer 12 is entirely covered by the second patch layer 18. Optionally, the second gas 318 can be exhausted from the repair chamber 309 after deposition of the first patch layer 18. In order to serve as a baseline of whether the second patch layer 18 can effectively prevent material loss thereof or material loss of the first patch layer 12 during a subsequent cleaning operation (as will be discussed in FIG. 11 to FIG. 14), a first critical dimension CD1 of a selected mask feature adjacent to the second patch layer 18 (or the first predetermined area DA1) is measured.

Figure 11:
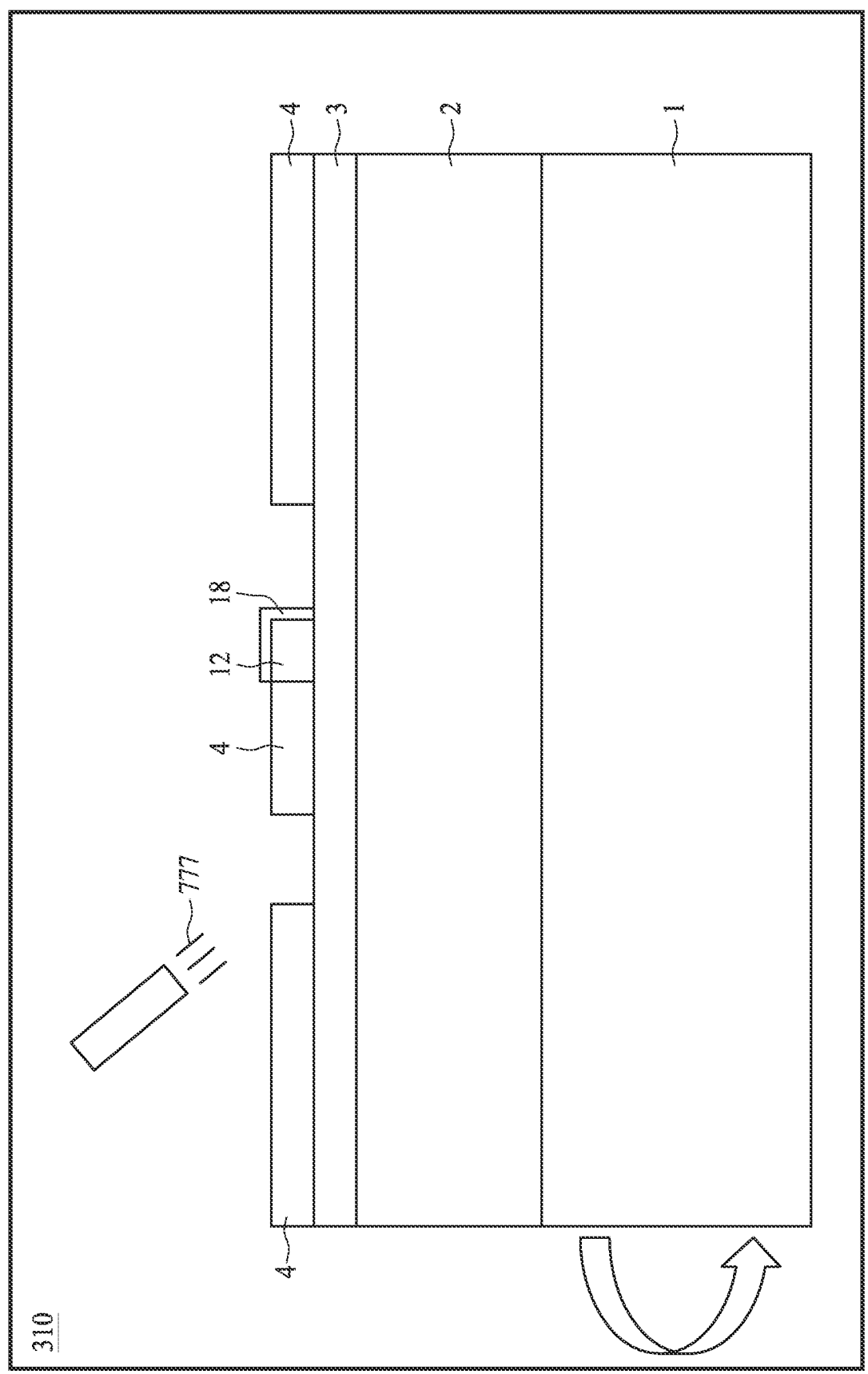
FIG. 11 to 14 show cross sectionals view of a photomask during intermediate cleaning operations, according to some embodiments of present disclosure.

Referring to FIG. 11, FIG. 11 is a cross sectional view of a photomask during intermediate cleaning operations, according to some embodiments of present disclosure. The repaired photomask 100 as any example discussed in FIG. 6 to FIG. 9A or FIG. 9A' (or the repaired photomask 100x as discussed in FIG. 10A to FIG. 10F) is provided and positioned in a cleaning chamber 310. For the purpose of conciseness, hereinafter the example of the photomask 100 is provided. It should be noted that similar operation can also be applied to the repaired photomask 100x. In a cleaning operation, a cleaning chemical 777 or a cleaning treatment is applied on the photomask 100. The cleaning chemical 777 or the cleaning treatment includes, but not limited to, combination of deionized water and ozone ($O_3$), application of deionized water and irradiation of light (such as ultraviolet (UV)), combination of $H_2O$ and hydrogen dioxide ($H_2O_2$), Sulfuric acid ($H_2SO_4$), SC1 solution (solution including $NH_4OH$, $H_2O_2$, $H_2O$), SPM solution (solution including $H_2SO_4$, $H_2O_2$, $H_2O$), wet chemical that includes acidic formulation, wet chemical that includes basic formulation, wet chemical that includes hydrogen dioxide ($H_2O_2$), Ammonium hydroxide ($NH_4OH$), wet chemical that includes reactive chemical, or any other chemical suitable for cleaning a photomask. During dispensing the cleaning chemical 777, the photomask 100 is spun by a rotator, so the cleaning chemical can be spread out with improved uniformity. The selected cleaning recipe may effectively remove some contaminations of the photomask 100. The cleaning operation illustrated in FIG. 11 is to introduce chemical force in the process.

In a comparative embodiment of a photomask only repairing with a chromium-containing layer, a portion of the chromium-containing layer may be removed, and the pattern that can absorb incident light may be distorted. The method for forming the photomask 100, photomask 100y, and the photomask 100x as provided in the present disclosure is able to alleviate the material loss of the patch layers deposited on the photomask during the aforesaid cleaning cycles.

Figure 12:
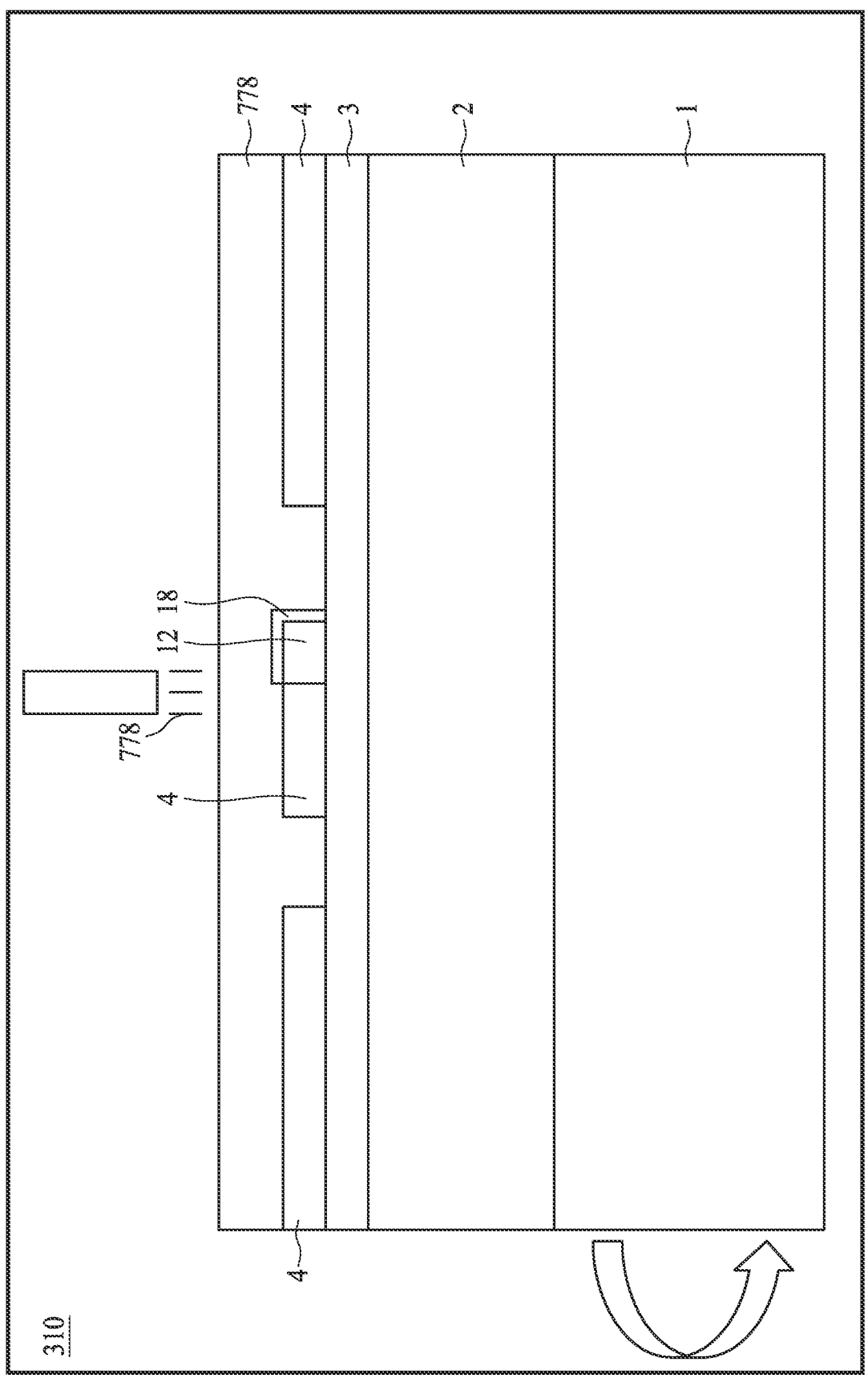

Referring to FIG. 12, FIG. 12 is a cross sectional view of a photomask during intermediate cleaning operations, according to some embodiments of present disclosure. A photoresist 778 is coated on the photomask 100 and cured. The photomask 100 is spun during applying the photoresist 778. The cleaning operation illustrated in FIG. 12 is to introduce spinning force in the process.

Figure 13:
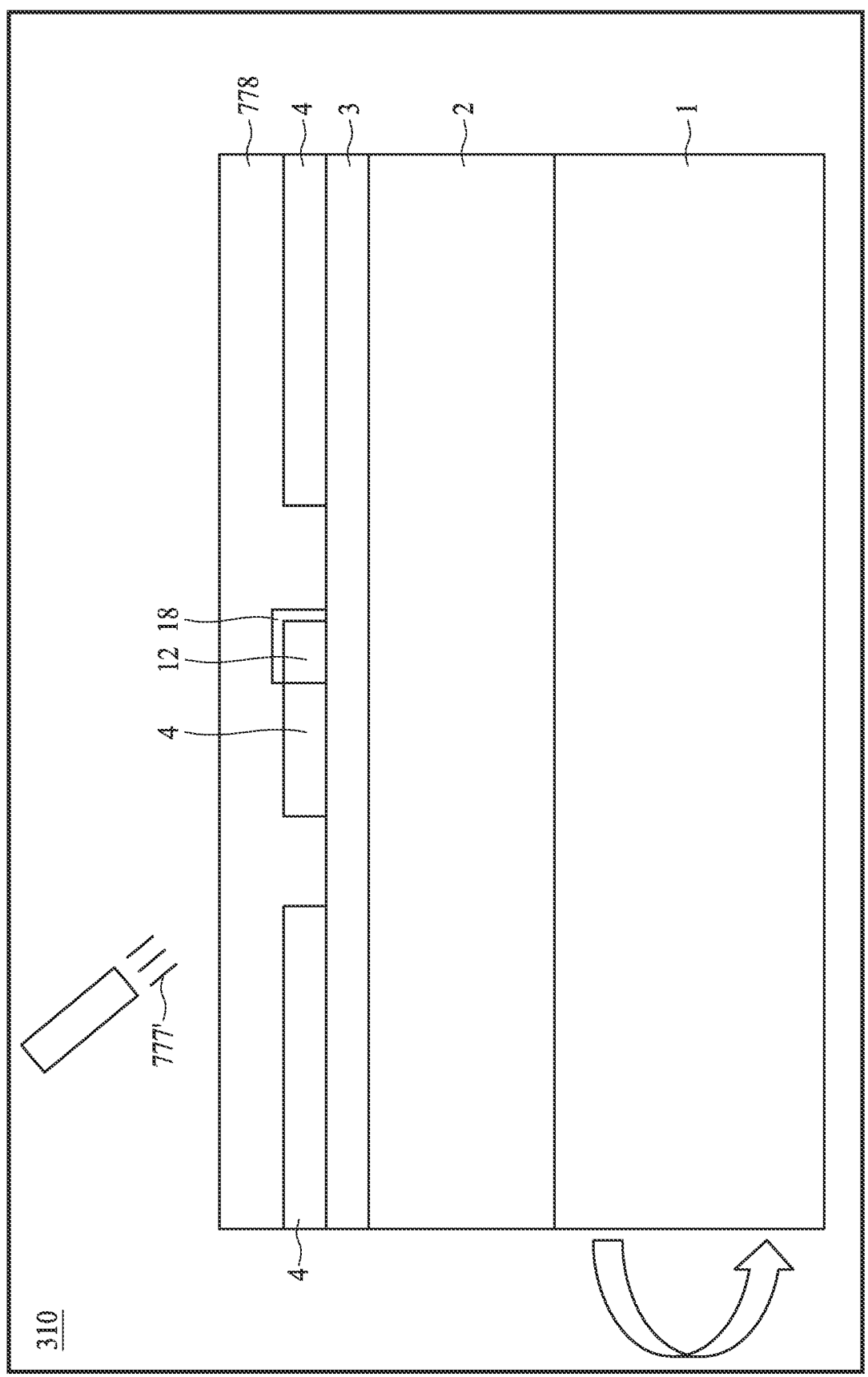
Figure 14:
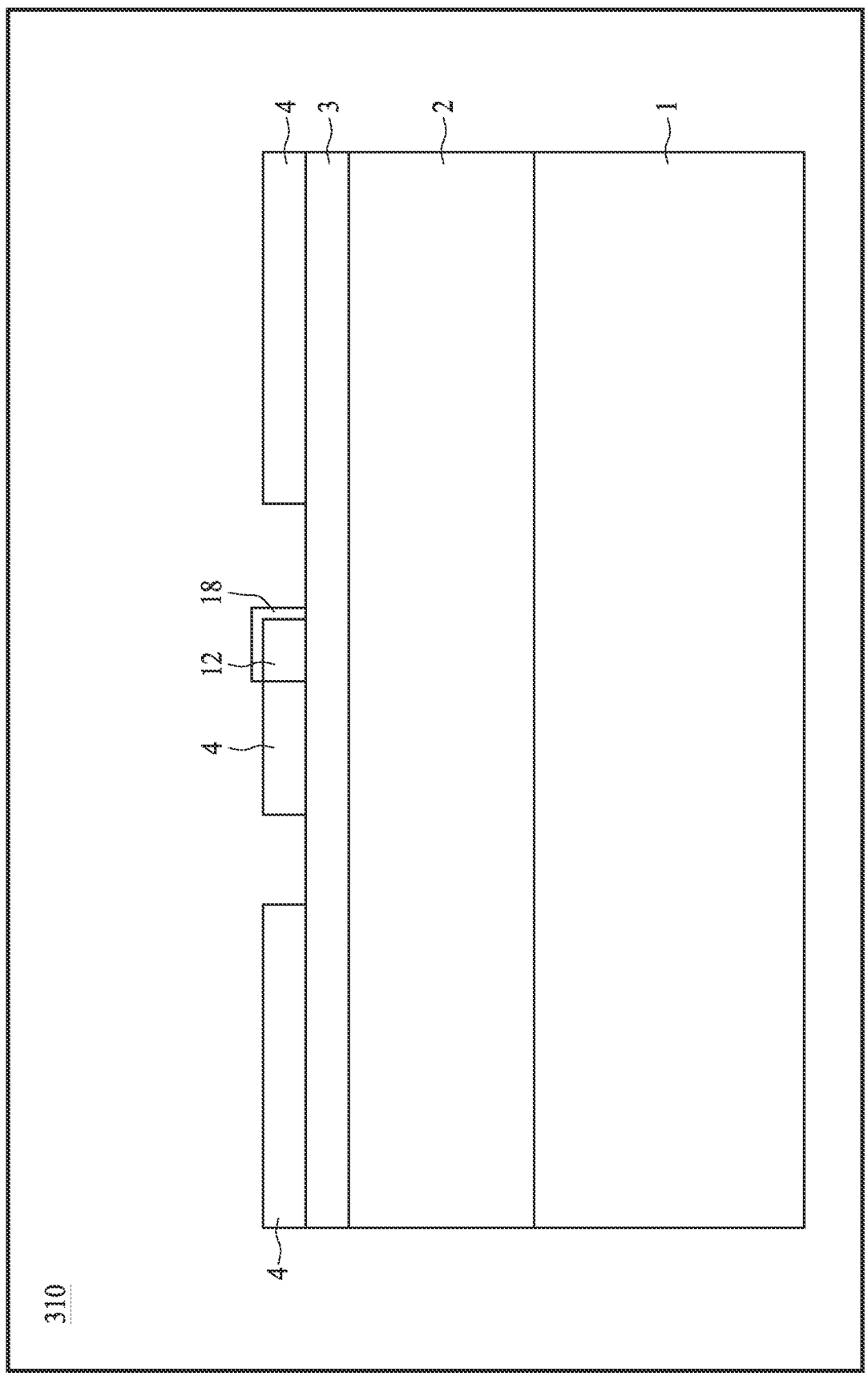

Referring to FIG. 13 and FIG. 14, FIG. 13 and FIG. 14 show cross sectional views of a photomask during intermediate cleaning operations, according to some embodiments of present disclosure. A cleaning operation is performed by applying a cleaning chemical 777' or by cleaning treatment.

The cleaning chemical 777' or the cleaning treatment includes, but not limited to, combination of deionized water and ozone ($O_3$), application of deionized water and irradiation of light (such as ultraviolet (UV)), combination of $H_2O$ and hydrogen dioxide ($H_2O_2$), Sulfuric acid ($H_2SO_4$), SC1 solution (solution including $NH_4OH$, $H_2O_2$, $H_2O$), SPM solution (solution including $H_2SO_4$, $H_2O_2$, $H_2O$), wet chemical that includes acidic formulation, wet chemical that includes basic formulation, wet chemical that includes hydrogen dioxide ($H_2O_2$), Ammonium hydroxide ($NH_4OH$), wet chemical that includes reactive chemical, or any other chemical suitable for cleaning a photomask. The photomask 100 is spun during applying the cleaning chemical 777'. Optionally, a photoresist strip can optionally be performed to remove at least a portion of the remaining photoresist 778. The cleaning operation illustrated in FIG. 13 is to introduce physical force by stripping off a photoresist layer in the process.

Figure 15A:
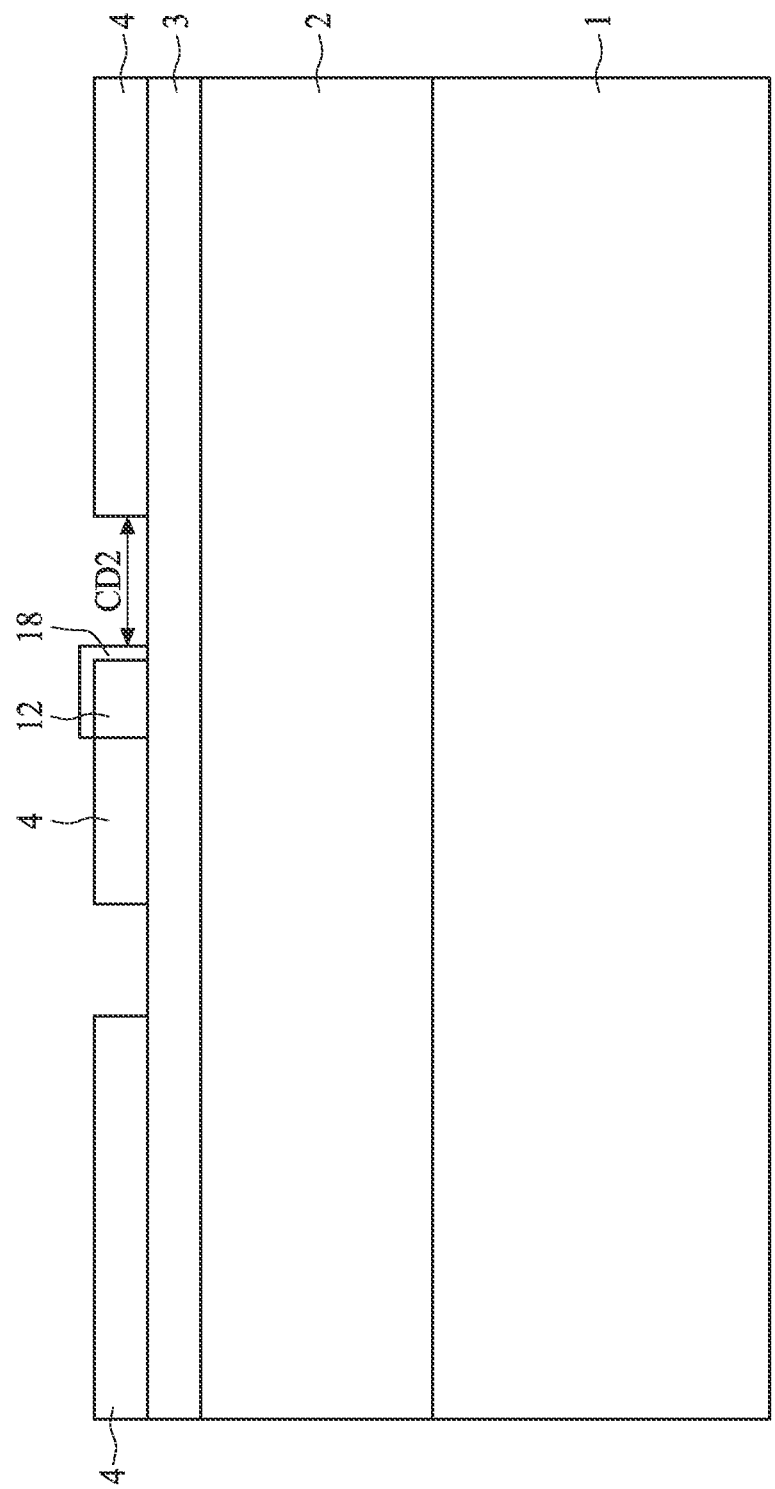
FIG. 15A is a cross sectional view of a photomask during intermediate repairing operations, according to some embodiments of present disclosure.

Referring to FIG. 15A, FIG. 15A is a cross sectional view of a photomask during intermediate operations of repairing operations, according to some embodiments of present disclosure. In order to serve as a baseline of whether the second patch layer 18 can effectively prevent material loss, a second critical dimension CD2 of the selected mask feature, where the first critical dimension CD1 was previously measured, is measured and compared to the first critical dimension CD1. If a difference of the second critical dimension CD2 and the first critical dimension CD1 (i.e. CD2–CD1) is less than a predetermined threshold portion (such as 10%) of the first critical dimension CD1, the repairing of the photomask 100 can be deemed completed. Otherwise, the photomask 100 may undergo the repairing operation and the cleaning operation again. Alternatively, a thickness of the second patch layer 18, or the combination of the first patch layer 12 and the second patch layer 18, can be used as a baseline. If such thickness decreases less than a predetermined value (such as 10 nm), the repairing of the photomask 100 can be deemed completed. Alternatively, the pattern of the absorber layer 4 and its adjacent patch layer (the first patch layer 12 and the second patch layer 18, or, only the second patch layer 18) can be compared to the predetermined layout design pattern.

Figure 15B:
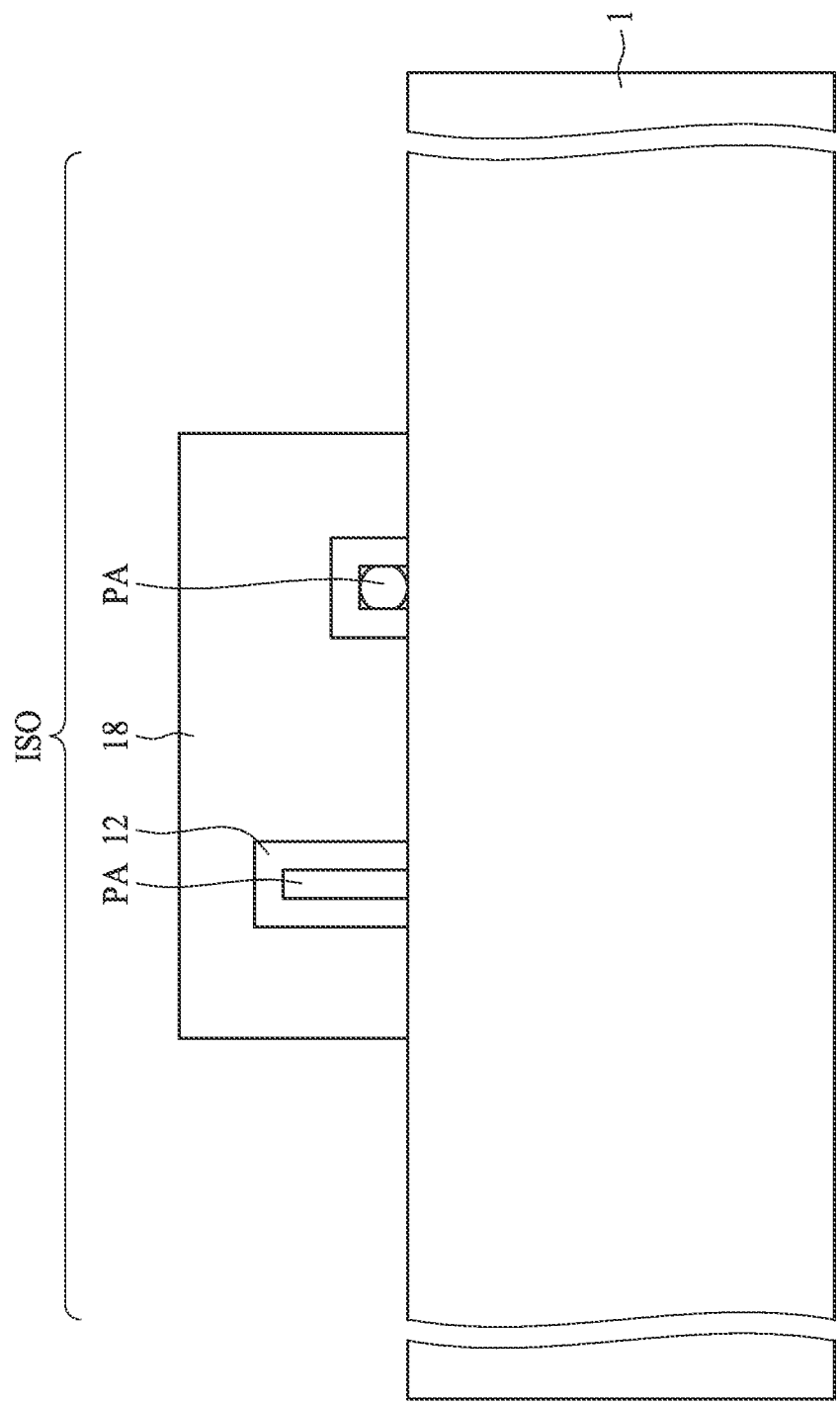
FIG. 15B is a cross sectional view of a photomask during intermediate repairing operations, according to some embodiments of present disclosure.

Referring to FIG. 15B, FIG. 15B is a cross sectional view of a photomask during intermediate operations of repairing operations, according to some embodiments of present disclosure. In some embodiments, the absorb rate (or the reflection rate) in the isolation region ISO can be inspected and used to determine whether the repairing of the photomask 100 (or photomask 100y) can be deemed completed, or repair should be performed again.

Figure 15C:
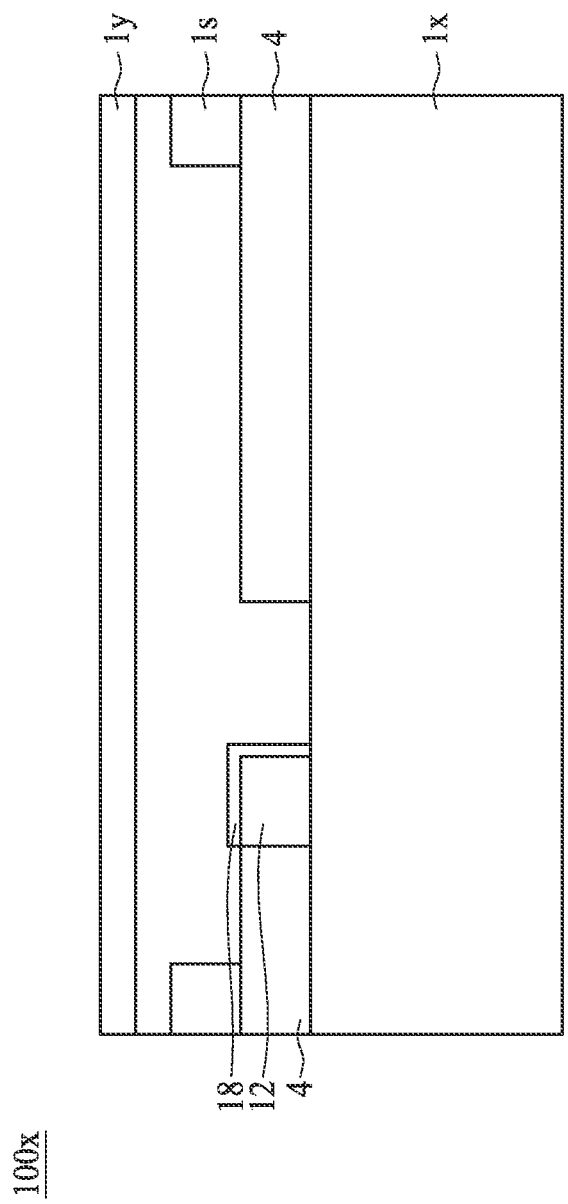
FIG. 15C is a cross sectional view of a photomask during intermediate repairing operations, according to some embodiments of present disclosure.

Referring to FIG. 15C, FIG. 15C is a cross sectional view of a photomask during intermediate operations of repairing operations, according to some embodiments of present disclosure. Similar to FIG. 15A, if a difference of the second critical dimension CD2 and the first critical dimension CD1 (i.e. CD2–CD1) is less than a predetermined threshold portion (such as 10%) of the first critical dimension CD1, the repairing of the photomask 100x can be deemed completed. Alternatively, the pattern of the absorber layer 4 and its adjacent patch layer can be compared to the desirable layout design pattern. If the repairing operation is deemed completed, a pellicle layer 1y can be disposed above the substrate 1x of the photomask 100x.

Figure 16A:
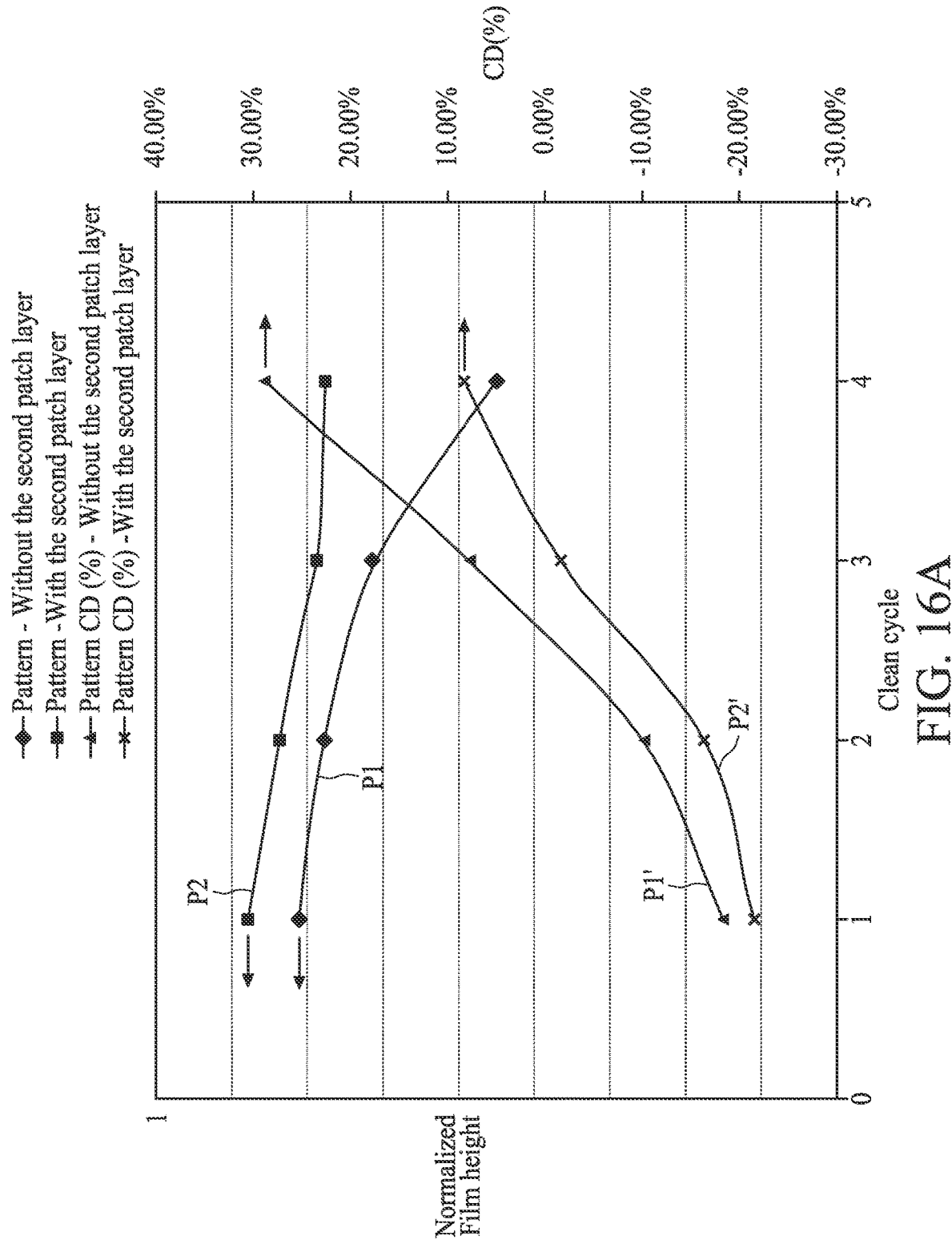
FIG. 16A shows a relationship between a thickness of deposited patch layer in pattern region and number of cycles of cleaning operation performed, as well as a relationship between a change of critical dimension in pattern region and number of cycles of cleaning operation performed, according to some embodiments of present disclosure.

Referring to FIG. 16A, FIG. 16A shows a relationship between a thickness of deposited patch layer in pattern region (left vertical axis) and number of cycles of cleaning operation performed, as well as a relationship between a change of critical dimension in pattern region (right vertical axis) and number of cycles of cleaning operation performed, according to some embodiments of present disclosure. Curve P1 and curve P1' shows data points of a repaired photomask only deposited with a first patch layer 12 in pattern region 6. Curve P2 and curve P2' shows data points of a repaired photomask deposited with the first patch layer 12 and the second patch layer 18 covering the first patch layer 12 in pattern region 6 (as shown in FIG. 2A or FIG. 15A). It can be observed that by depositing the second patch layer 18 covering the first patch layer 12, after 4 cleaning cycles, critical dimension (CD %) enlargement is reduced from about 30% without the second patch layer 18 to about 10% with the second patch layer 18, and the film height is greater with the deposition of the second patch layer 18 than without the second patch layer 18, evidencing that the material loss of the repaired photomask can be alleviated through the additional second patch layer 18.

Figure 16B:
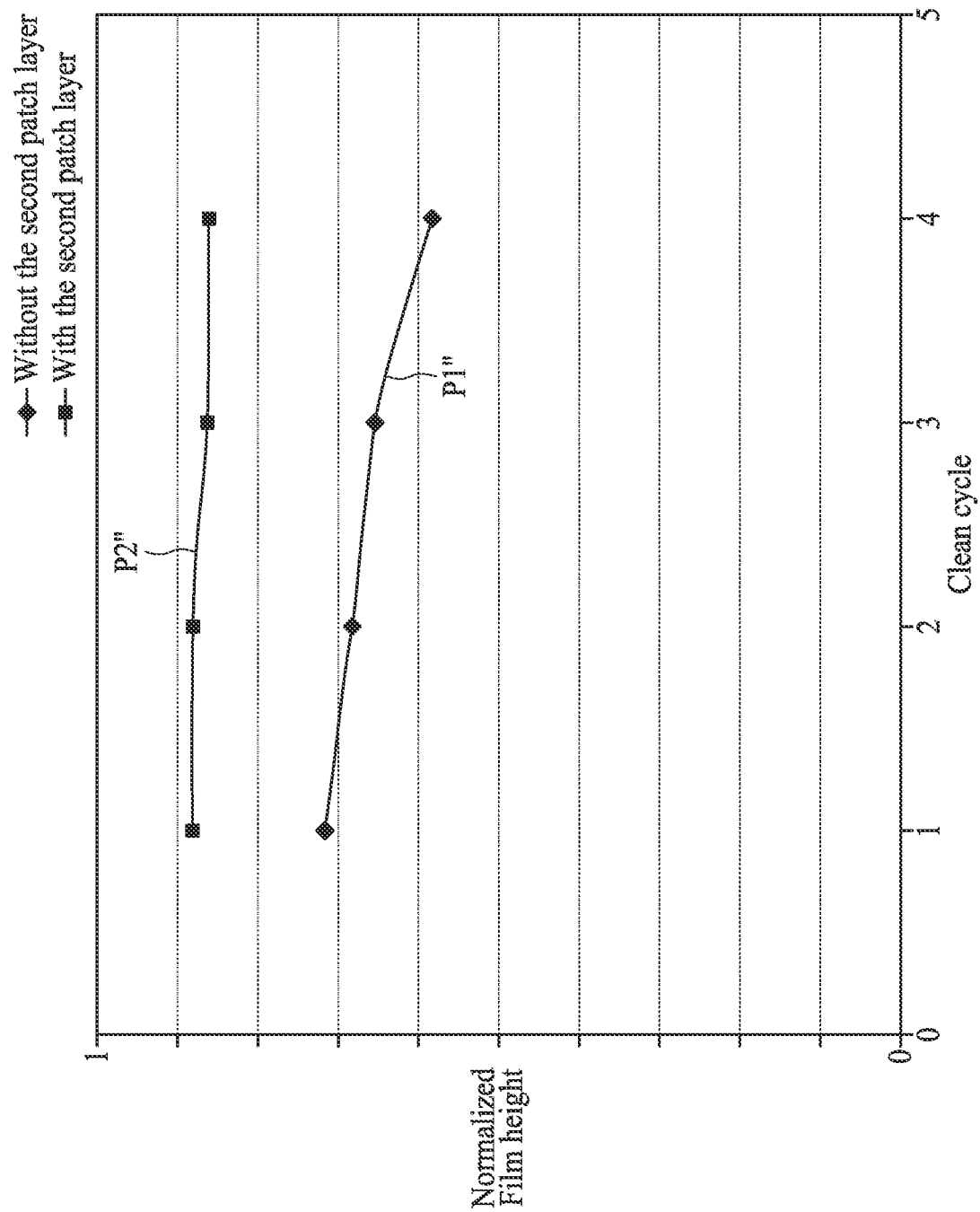
FIG. 16B shows a relationship between a thickness of deposited patch layer in isolation region and number of cycles of cleaning operation performed, according to some embodiments of present disclosure.

Referring to FIG. 16B, FIG. 16B shows a relationship between a thickness of deposited patch layer in isolation region and number of cycles of cleaning operation performed, according to some embodiments of present disclosure. Comparing to only depositing a first patch layer 12 in the isolation region ISO (curve P1"), further depositing a second patch layer 18 covering the first patch layer 12 (curve P2") alleviate the thickness loss of the repaired part in the isolation region ISO of the photomask.

Figure 16C:
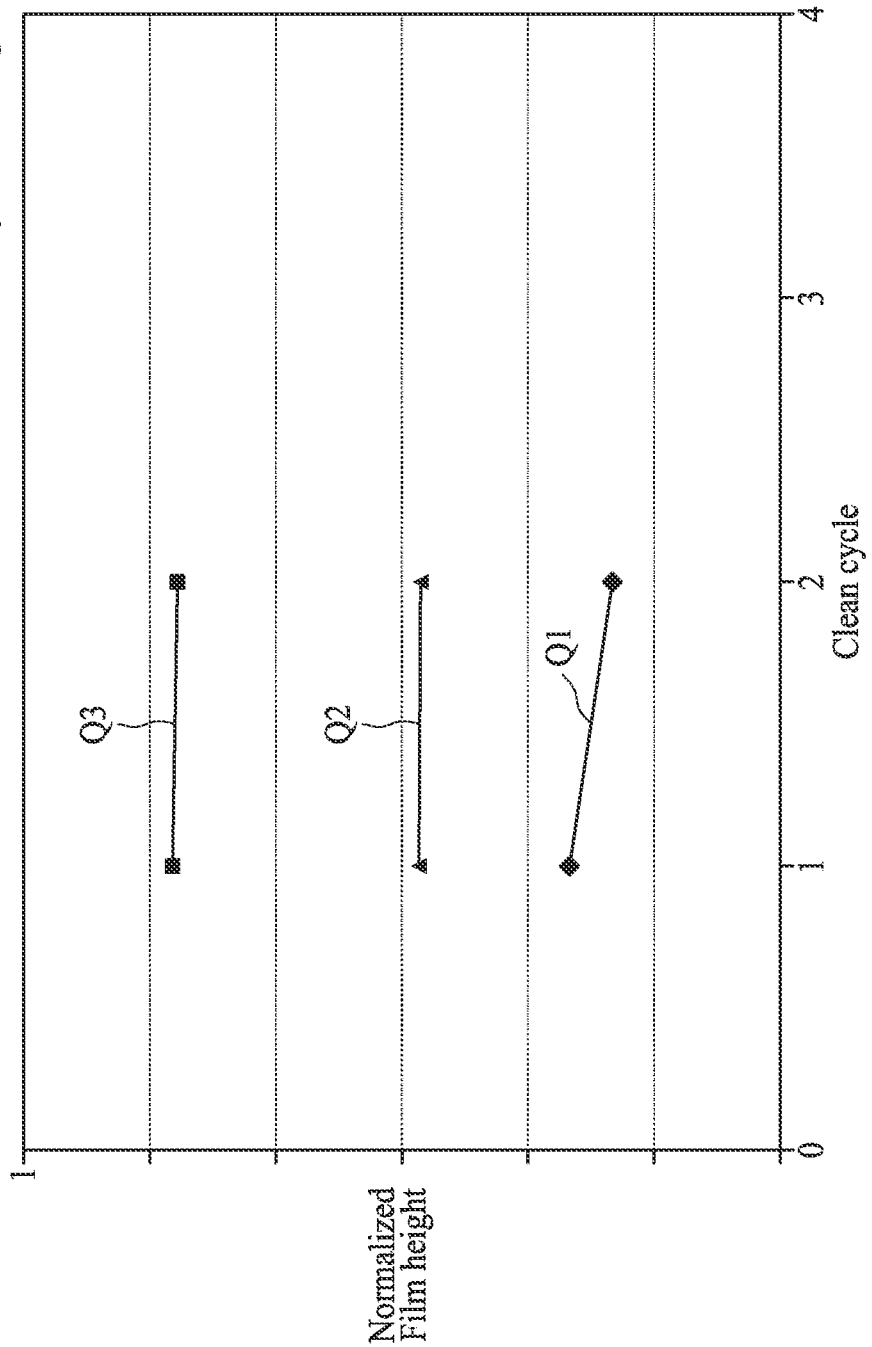
FIG. 16C shows a relationship between a thickness of deposited patch layer and number of cycles of cleaning operation performed, according to some embodiments of present disclosure.

Referring to FIG. 16C, FIG. 16C shows a relationship between a thickness of deposited patch layer and number of cycles of cleaning operation performed, according to some embodiments of present disclosure. Comparing to only depositing a first patch layer 12 (line Q1), depositing only a second patch layer 18 (line Q2) or depositing a second patch layer 18 over the first patch layer 12 (line Q3) can both alleviate thickness loss of the repaired part in the isolation region ISO of the photomask.

Figure 17:
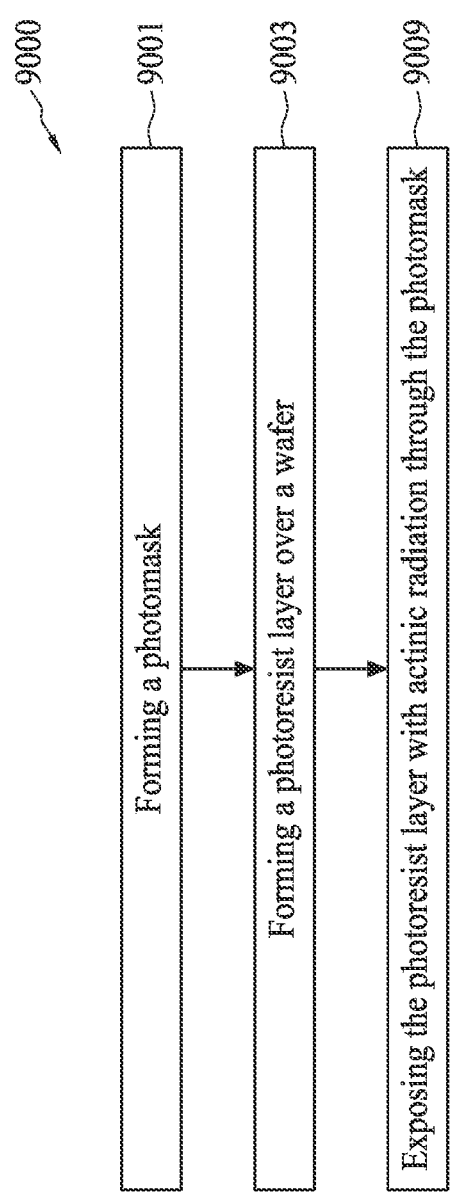
FIG. 17 shows a flow chart representing a method for fabricating a semiconductor device, in accordance with some embodiments of the present disclosure.

Referring to FIG. 17, FIG. 17 shows a flow chart representing a method for fabricating a semiconductor device, in accordance with some embodiments of the present disclosure. The method 9000 for fabricating a semiconductor device includes forming a photomask (operation 9001), forming a photoresist layer over a wafer (operation 9003), and exposing the photoresist layer with actinic radiation through the photomask (operation 9009).

The photomask 100, 100x, or 100y provided in the present disclosure can be positioned in an exposure chamber, and the photomask can be used to pattern a photoresist layer coated on a wafer.

The present disclosure provides a photomask and a method for forming photomask, specifically including repairing and cleaning the photomask. With regard to pattern region of a photomask, by depositing a second patch layer 18 (which may be a silicon derivative layer) over the first patch layer 12 (which may be a chromium-containing layer) adjacent to the absorber layer 4 with defect, or by depositing a second patch layer 18 (which may be a silicon derivative layer) adjacent to the absorber layer 4 with defect, the material loss of the patch layer can be alleviated. With regard to the isolation region ISO of a photomask, by depositing a second patch layer 18 (which may be a silicon derivative layer) and the first patch layer 12 (which may be a chromium-containing layer) over the detected particles in the isolation region, or by depositing a second patch layer 18 (which may be a silicon derivative layer) over the detected particles in the isolation region, the reflection issue from the isolation region can be alleviated. The repairing methods provided by the present disclosure are incorporated with relatively strong cleaning treatment for effectively cleaning contaminant.

Some embodiments of the present disclosure provide a photomask, including a substrate having a front side, an absorber layer over the front side of the substrate, a first patch layer over the front side of the substrate and adjacent to a sidewall of the absorber layer, and a second patch layer over the first patch layer.

Some embodiments of the present disclosure provide a photomask, including a substrate, an absorber layer over the substrate, a silicon derivative layer over the substrate, wherein a bottom surface of the absorber is coplanar with a bottom layer of the silicon derivative layer.

Some embodiments of the present disclosure provide a method for repairing a photomask, including providing a photomask, wherein the photomask comprises a substrate and an absorber layer over the substrate, applying a silicon-containing gas over the photomask, and depositing a first silicon derivative layer adjacent to the absorber layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A photomask, comprising:
   a substrate;
   a reflective multi-layer stack over the substrate;
   a capping layer over the reflective multi-layer stack;
   an absorber layer over the capping layer;
   a first patch layer in direct contact with the absorber layer; and
   a second patch layer over a surface of the first patch layer.

2. The photomask of claim 1, wherein a material of the first patch layer comprises chromium.

3. The photomask of claim 1, wherein a material of the second patch layer comprises silicon oxide.

4. The photomask of claim 1, wherein a material of the second patch layer comprises silicon carbide.

5. The photomask of claim 1, wherein the second patch layer comprises:
   a first portion above a top surface of the first patch layer; and
   a second portion lining a sidewall of the first patch layer.

6. The photomask of claim 5, wherein a first thickness of the first portion of the second patch layer is greater than a second thickness of the second portion of the second patch layer.

7. The photomask of claim 6, wherein the first thickness is in a range from 1 nm to 10 nm.

8. The photomask of claim 6, wherein the second thickness is in a range from 0.5 nm to 10 nm.

9. A photomask, comprising:
   a substrate, comprising an isolation region and a pattern region different from the isolation region;
   an absorber layer over the pattern region; and
   a first patch layer over the isolation region, wherein defect particle is at a position between the first patch layer and a top surface of the substrate over the isolation region.

10. The photomask of claim 9, further comprising a second patch layer over the first patch layer.

11. The photomask of claim 9, wherein a material of the first patch layer comprises chromium.

12. The photomask of claim 10, wherein a material of the second patch layer comprises silicon oxide.

13. The photomask of claim 10, wherein a material of the second patch layer comprises silicon carbide.

14. The photomask of claim 9, wherein a material of the first patch layer comprises a silicon-derivative material.

15. A photomask, comprising:
   a substrate, comprising a pattern region;
   an absorber layer over the pattern region of the substrate, comprising a first portion and a second portion apart from the first portion; and
   a first patch layer over the substrate, wherein the first patch layer is in direct contact with the first portion of the absorber layer and apart from the second portion of the absorber layer.

16. The photomask of claim 15, wherein a material of the first patch layer is silicon-derivative material.

17. The photomask of claim 15, wherein a material of the first patch layer is silicon oxide.

18. The photomask of claim 15, wherein a material of the first patch layer is silicon carbide.

19. The photomask of claim 15, wherein a thickness of the first patch layer is in a range from 90% of a thickness of the absorber layer to 110% of a thickness of the absorber layer.

20. The photomask of claim 15, further comprising a second patch layer over an isolation region over substrate and different from the pattern region, wherein a material of the second patch layer is identical to a material of the first patch layer.

* * * * *